(12) United States Patent
Ooishi

(10) Patent No.: US 6,172,928 B1
(45) Date of Patent: Jan. 9, 2001

(54) SEMICONDUCTOR MEMORY DEVICE WITH NORMAL MODE AND POWER DOWN MODE

(75) Inventor: Tsukasa Ooishi, Hyogo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/323,819

(22) Filed: Jun. 2, 1999

(30) Foreign Application Priority Data

Dec. 4, 1998 (JP) .................................................. 10-346051

(51) Int. Cl.[7] ........................................................ G11C 7/00
(52) U.S. Cl. .............................. 365/222; 365/229; 365/226
(58) Field of Search .................................. 365/226, 222, 365/229, 230.06, 189.05

(56) References Cited

U.S. PATENT DOCUMENTS 5,856,951 * 1/1999 Arimoto et al. .................... 365/226
5,959,927 * 9/1999 Yamagata et al. .................... 365/229

FOREIGN PATENT DOCUMENTS 9-231756    9/1997 (JP) .

* cited by examiner

*Primary Examiner*—David Nelms
*Assistant Examiner*—Thong Le
(74) *Attorney, Agent, or Firm*—McDermott, Will & Emery

(57) ABSTRACT

A semiconductor memory device includes a logic unit, a DRAM unit, and first and second PMOS transistors. In a normal mode, the first PMOS transistor is off and the second PMOS transistor is on, whereby power supply voltage is supplied to all the circuits. In a power down mode, the first PMOS transistor is on and the second PMOS transistor is off, so that power is not supplied to circuitry that is not required for a self refresh operation. Power supply voltage is provided to circuitry that is required for a self refresh operation. Thus, current consumption during self refresh can be reduced.

16 Claims, 19 Drawing Sheets

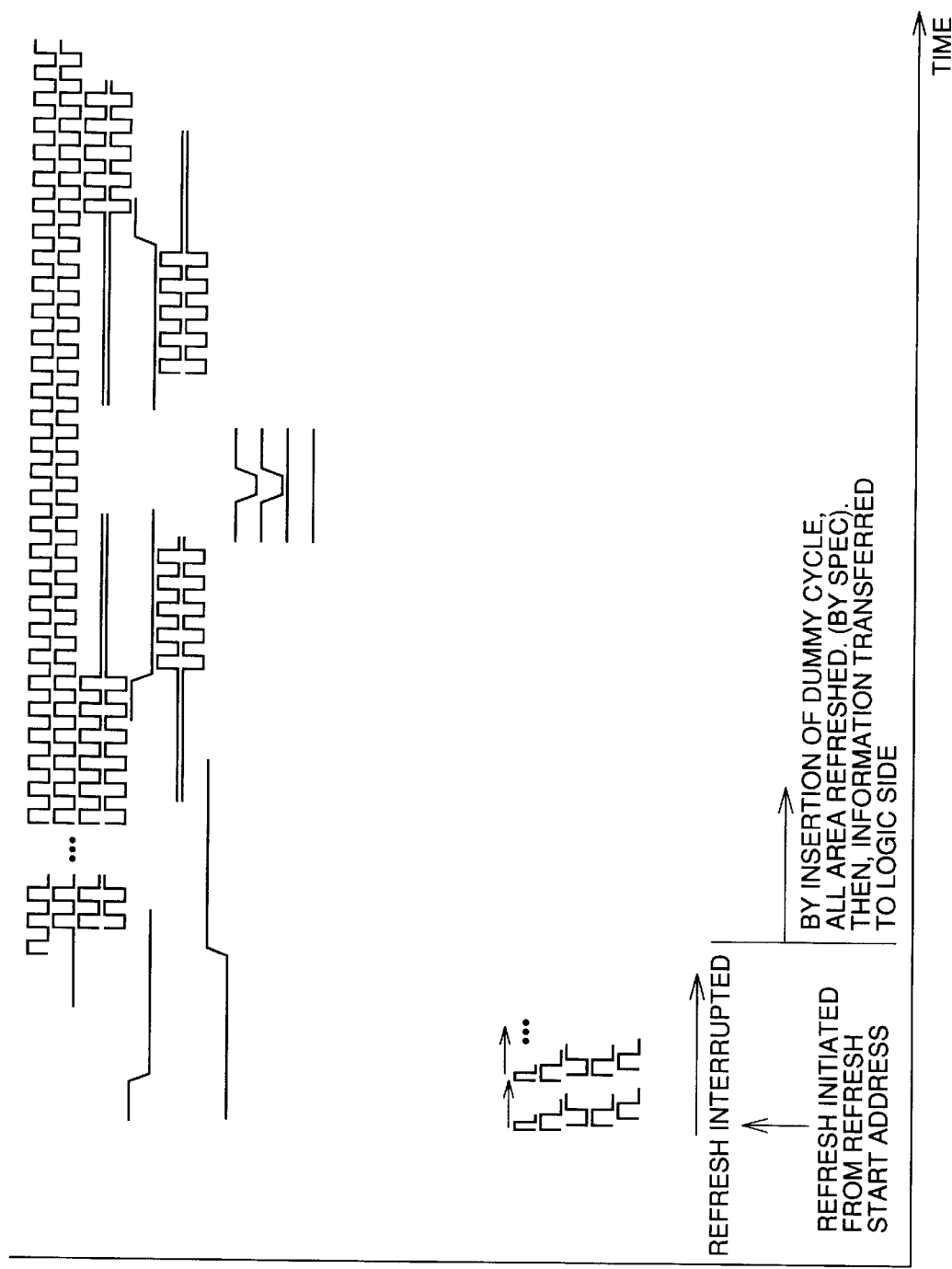

SEMICONDUCTOR MEMORY DEVICE WITH NORMAL MODE AND POWER DOWN MODE

BACKGROUND OF THE INVENTION

1. Field of the Invention

The present invention relates to semiconductor memory devices, and more particularly to a semiconductor memory device having a normal mode and a power down mode.

2. Description of the Background Art

In a semiconductor memory device referred to as a DRAM (Dynamic Random Access Memory), a refresh operation is carried out to maintain the data stored in a memory cell. This refresh operation is carried out on the basis of a word line. Upon application of a pulse to a selected word line, a read out of small signals•amplify•and rewrite operation are carried out for all the memory cells on the selected word line, whereby all the memory cells on the word line are refreshed at the same time. By sequentially selecting a word line in such a manner, all the memory cells will be refreshed. The method of executing a refresh operation includes the method of carrying out a refresh operation of one cycle (one word line) for every predetermined interval, and the method of refreshing all the memory cells at a burst at an elapse of a predetermined time.

During the execution of such a refresh operation, not only circuitry required for the refresh operation, but also circuitry irrelevant to the refresh operation operates. Therefore, leakage current is generated in association with activation of the transistors included in the circuitry that is not required for the refresh operation. This leakage current becomes so great as to reduce the threshold value of the transistor. Although the threshold value must be lowered in accordance with microminiaturization of the transistor, the entire current consumption of circuitry that uses such a transistor will increase.

SUMMARY OF THE INVENTION

An object of the present invention is to provide a semiconductor memory device that can reduce current consumption during a self refresh operation.

According to an aspect of the present invention, a semiconductor memory device with a normal mode and a power down mode includes a plurality of memory cells, a plurality of first word lines, a plurality of bit line pairs, a sense amplifier, an address buffer, a self refresh control circuit, a row decoder, a plurality of first word line drivers, a first power supply, and a second power supply. The plurality of memory cells are arranged in rows and columns. The plurality of first word lines are arranged in rows. The plurality of bit line pairs are arranged in columns. The sense amplifier amplifies the data signal of the plurality of bit line pairs. The address buffer generates an internal address signal in response to an external address signal. The self refresh control circuit generates a refresh address signal when in a power down mode. The row decoder responds to an internal address signal to generate a decode signal when in a normal mode, and responds to a refresh address signal to generate a decode signal when in a power down mode. The plurality of first word line drivers are provided corresponding to the plurality of first word lines to render a corresponding first word line active in response to a decode signal. The first power supply supplies a power supply voltage to the sense amplifier, the address buffer, the self refresh control circuit, the row decoder, and the plurality of first word line drivers when in a normal mode, and does not supply a power supply voltage to the sense amplifier, the address buffer, the self refresh control circuit, the row decoder, and the plurality of first word line drivers when in a power down mode. The second power supply provides a power supply voltage to the sense amplifier, the self refresh control circuit, the row decoder, and the plurality of first word line drivers when in a power down mode, and does not supply of a power supply voltage to the sense amplifier, the self refresh control circuit, the row decoder and the plurality of first word line drivers when in a normal mode.

In the above semiconductor memory device, power consumption during a self refresh operation can be reduced since power is not supplied to the address buffer that is not required for the self refresh operation when in a power down mode.

According to another aspect of the present invention, a semiconductor memory device that has a normal mode and a power down mode includes a main power supply line, a main ground line, first and second sub-power supply lines, first and second sub-ground lines, a plurality of memory cells, a plurality of first word lines, a plurality of bit line pairs, a sense amplifier, an address buffer, a self refresh control circuit, a row decoder, a plurality of first word line drivers, a first connection circuit, a second connection circuit, a third connection circuit and a fourth connection circuit. The main power supply line receives a power supply voltage. The main ground line receives a ground voltage. The plurality of memory cells are arranged in rows and columns. The plurality of first word lines are arranged in rows. The plurality of bit line pairs are arranged in columns. The sense amplifier amplifies the data signal of the plurality of bit line pairs. The address buffer generates an internal address signal in response to an external address signal. The self refresh control circuit generates a refresh address signal when in a power down mode. The row decoder generates a decode signal in response to an internal address signal when in a normal mode and in response to a refresh address signal when in a power down mode. The plurality of first word line drivers are provided corresponding to the plurality of first word lines to render a corresponding first word line active in response to a decode signal. The first connection circuit sets the main power supply line and the first sub-power supply line connected and unconnected when in a normal mode and in a power down mode, respectively. The second connection circuit sets the main ground line and the first sub-ground line connected and unconnected when in a normal mode and in a power down mode, respectively. The third connection circuit sets the main power supply line and the second sub-power supply line connected and unconnected when in a power down mode and in a normal mode, respectively. The fourth connection circuit sets the main ground line and the second sub-ground line connected and unconnected when in a power down mode and in a normal mode, respectively. The address buffer includes a plurality of first logic circuits and a plurality of second logic circuits. The plurality of first logic circuits are connected between the main power supply line and the first sub-ground line to output a signal of a high logic level when in a power down mode. The plurality of second logic circuits are connected between the first sub-power supply line and the main ground line to output a signal of a low logic level when in a power down mode. The self refresh control circuit includes a plurality of third logic circuits, and a plurality of fourth logic circuits. The plurality of third logic circuits are connected between the main power supply line and the second sub-ground line to output a signal of a high logic level when in a normal mode. The plurality of fourth logic circuits are connected between the second sub-power supply line and the main ground line to output a signal of a low logic level when in a normal mode.

In the above semiconductor memory device, the address buffer does not operate when in a power down mode. Therefore, the subthreshold current flowing through the plurality of first and second logic circuits can be reduced by setting the main power supply line and the first sub-power supply line unconnected and the main ground line and the first sub-ground line unconnected by the first and second connection circuits, respectively. In a normal mode, the self refresh control circuit does not operate. Therefore, the subthreshold current flowing through the plurality of third and fourth logic circuits can be reduced by setting the main power supply line and the second sub-power supply line unconnected and the main ground line and the second sub-ground line unconnected by the third and fourth connection circuits, respectively.

According to a further aspect of the present invention, a semiconductor memory device having a normal mode and a power down mode includes a logic unit with a plurality of logic circuit groups, and a DRAM unit. The DRAM unit includes a plurality of memory cells, a plurality of first word lines, a plurality of bit line pairs, a sense amplifier, an address buffer, a self refresh control circuit, a row decoder, and a plurality of first word line drivers. The plurality of memory cells are arranged in rows and columns. The plurality of first word lines are arranged in rows. The plurality of bit line pairs are arranged in columns. The sense amplifier amplifies the data signal of the plurality of bit line pairs. The address buffer generates an internal address signal in response to an external address signal. The self refresh control circuit generates a refresh address signal when in a power down mode. The row decoder generates a decoded signal in response to an internal address signal and in response to a refresh address signal when in a normal mode and in a power down mode, respectively. The plurality of first word line drivers are provided corresponding to the plurality of first word lines to render a corresponding first word line active in response to a decoded signal.

The semiconductor memory device further includes a first power supply, a second power supply, and a temporary save circuit. The first power supply supplies a power supply voltage to the logic unit, the sense amplifier, the address buffer, the self refresh control circuit, the row decoder, and the plurality of first word line drivers when in a normal mode, and does not supply a power supply voltage to the logic unit, the sense amplifier, the address buffer, the self refresh control circuit, the row decoder, and the plurality of first word line drivers when in a power down mode. The second power supply supplies a power supply voltage to the sense amplifier, the self refresh control circuit, the row decoder and the plurality of first word line drivers when in a power down mode, and does not supply a power supply voltage to the sense amplifier, the self refresh control circuit, the row decoder, and the plurality of first word line drivers when in a normal mode. The temporary save circuit temporarily saves the data of the plurality of logic circuit groups into the DRAM unit before a power down mode is entered.

The semiconductor memory device does not have the data in the logic unit lost even when power is not supplied to the logic unit during a power down mode.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 23 is a timing chart for describing an operation of returning the serial data transferred to the DRAM unit to the logic unit.

DESCRIPTION OF THE PREFERRED EMBODIMENTS

Figure 1:
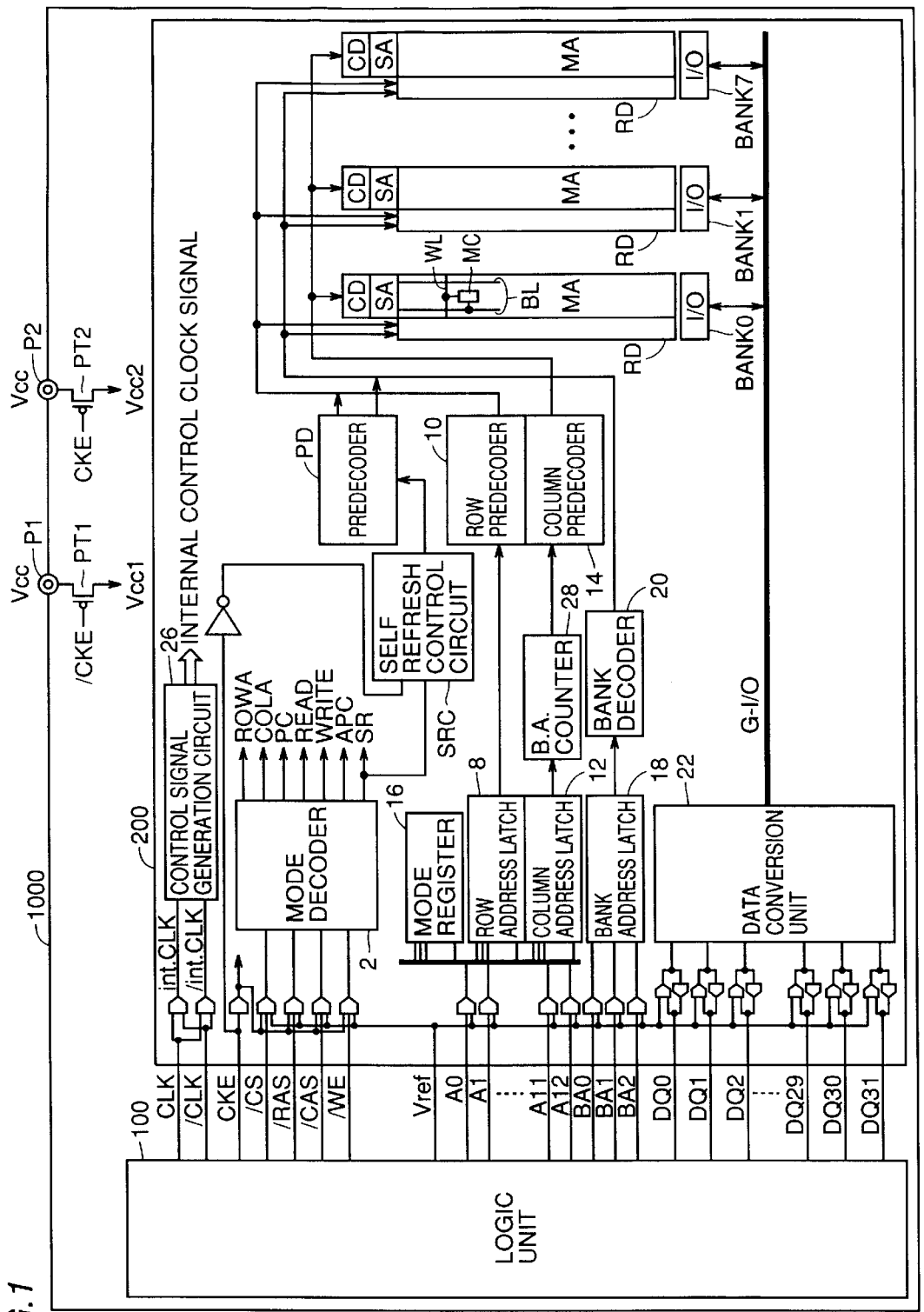
FIG. 1 is a block diagram showing an entire structure of a semiconductor memory device according to a first embodiment of the present invention.

Embodiments of the present invention will be described hereinafter with reference to the drawings. In the drawings, the same or corresponding component have the same reference characters allotted, and their description will not be repeated.

First Embodiment

Referring to FIG. 1, a semiconductor memory device according to a first embodiment of the present invention includes a logic unit 100 and a DRAM unit 200, and P channel MOS transistors PT1 and PT2, formed on the same chip 1000. Between logic unit 100 and DRAM unit 200 are transferred complementary control signals CLK and /CLK which are the reference of the operation of the entire DRAM unit 200, a clock enable signal CKE that allows input to DRAM 200, a signal /CS identifying input of a command, a signal /RAS indicating input of a row related command, a signal /CAS indicating input of a column related command, a signal /WE which is an identification signal of read and write, a reference potential Vref determining the H level (logical high)/L level (logical low) of an input signal, address signals A0–A12, bank addresses BA0–BA2 of eight incorporated memory banks, and input/output signals DQ0–DQ31 of data of 32 bits.

DRAM unit 200 does not operate when clock enable signal CKE is not rendered active. During this inactive period, DRAM unit 200 attains a power down mode or a self refresh mode.

During activation of signal ICS, a command is recognized at a rising edge of a clock.

As to address signals A0–A12, all the thirteen bits are used as an input of a row address, whereas ten bits out of the thirteen bits are used for an input of a column address. Also, the address signals are partially used for writing into a mode register.

DRAM unit 200 includes a control signal generation circuit 26 receiving control signals CLK and /CLK to generate an internal control clock signal, a mode decoder 2 recognizing an input command, a mode register 16 retaining an operation mode, a row address latch 8 receiving a row address, a column address latch 12 receiving a column address, a bank address latch 18 receiving a bank address signal from the bank address, and a bank decoder 20 decoding the bank address from bank address latch 18 to render a corresponding bank active.

DRAM unit 200 further includes a self refresh control circuit SRC generating a refresh address in a refresh operation, and a predecoder PD receiving a refresh address from self refresh control circuit SRC to output a corresponding signal to row decoder RD.

DRAM unit 200 further includes a row predecoder 10 receiving an address output from row address latch 8 to output a corresponding signal to row decoder RD, a burst address counter 28 generating a column address continuously in a burst operation, and a column predecoder 14 receiving an address output from burst address counter 28 to output a corresponding signal to column decoder CD.

DRAM unit 200 further includes a data conversion unit 22 converting the data rate between an external source of DRAM unit 200 and a global data bus G-I/O to transfer data, and memory banks BANK0–BANK7 to transfer data with global data bus G-I/O according to the outputs of row predecoder 10, column predecoder 14 and bank decoder 20. Global data bus G-I/O transfers data with eight memory banks BANK0–BANK7.

Each of memory banks BANK0–BANK7 includes a memory cell array MA, a row decoder RD, a column decoder CD, a sense amplifier SA, and an input/output circuit I/O. Memory cell array MA includes a plurality of memory cells MC arranged in rows and columns, a plurality of word lines WL arranged in rows, and a plurality of bit line pairs BL arranged in columns. Row decoder RD generates a decode signal in response to a signal from row predecoder 10 or predecoder PD. Column decoder CD selects a corresponding bit line pair BL in response to a signal from column predecoder 14. Sense amplifier SA amplifies a data signal of a memory cell MC read out on bit line pair BL. Input/output circuit I/O transfers a data signal between the bit line pair BL selected by column decoder CD and global input/output line pair G-I/O.

P channel MOS transistor PT1 is connected between a pin P1 receiving an external power supply voltage Vcc and a power supply node Vcc1 to be turned on/off in response to a signal /CKE which is an inverted version of clock enable signal CKE. P channel MOS transistor PT2 is connected between a pin P2 receiving an external power supply voltage Vcc and a power supply node Vcc2 to be turned on/off in response to clock enable signal CKE.

Figure 2:
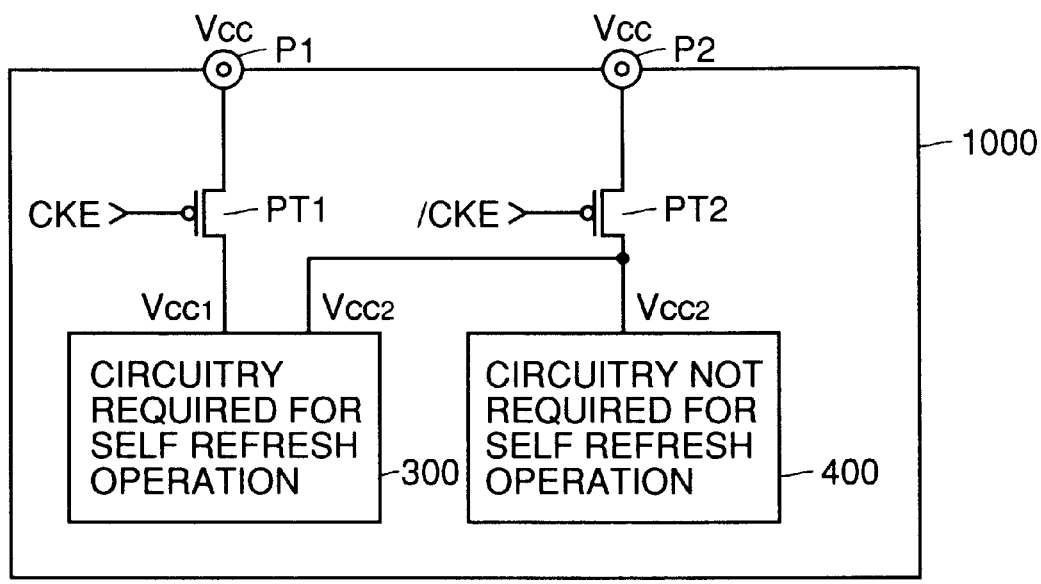
FIG. 2 is a block diagram showing a power supply system of the semiconductor memory device of FIG. 1.

Referring to the block diagram of FIG. 2 of the power supply system of the semiconductor memory device of FIG. 1, the circuitry forming the semiconductor memory device is mainly divided into circuitry 300 required for a self refresh operation and circuitry 400 not required for a self refresh operation. Circuitry 300 required for a self refresh operation includes self refresh control circuit SRC, predecoder PD, and memory banks BANK0–BANK7 of the semiconductor memory device of FIG. 1. Circuitry 400 not required for a self refresh operation includes logic unit 100, control signal generation circuit 26, mode decoder 2, mode register 16, row address latch 8, column address latch 12, bank address latch 18, data conversion unit 22, burst address counter 28, bank decoder 20, row predecoder 10, and column predecoder 14.

The semiconductor memory device enters a normal mode when clock enable signal CKE is at an H level. Here, P channel MOS transistor PT1 is off and P channel MOS transistor PT2 is on. Accordingly, power supply voltage Vcc2 from pin P2 is supplied to circuitry 300 required for a self refresh operation and circuitry 400 not required for a self refresh operation, i.e., to all the circuits in the semiconductor memory device. Thus, the semiconductor memory device operates in a normal mode.

The semiconductor memory device enters a power down mode when clock enable signal CKE is at an L level. P channel MOS transistor PT1 is on and P channel MOS transistor PT2 is off. Power supply is not supplied to circuitry 400 that is not required for a self refresh operation. Therefore, leakage current will not be generated in the transistors included in such circuitry.

As a result, current consumption is reduced in the power down mode. In contrast, power supply voltage Vcc1 from pin P1 is supplied to circuitry 300 required for a self refresh operation. A refresh operation is carried out by power supply voltage Vcc1 even during a power down mode. Therefore, the data of memory cell MC is retained.

Figure 3:
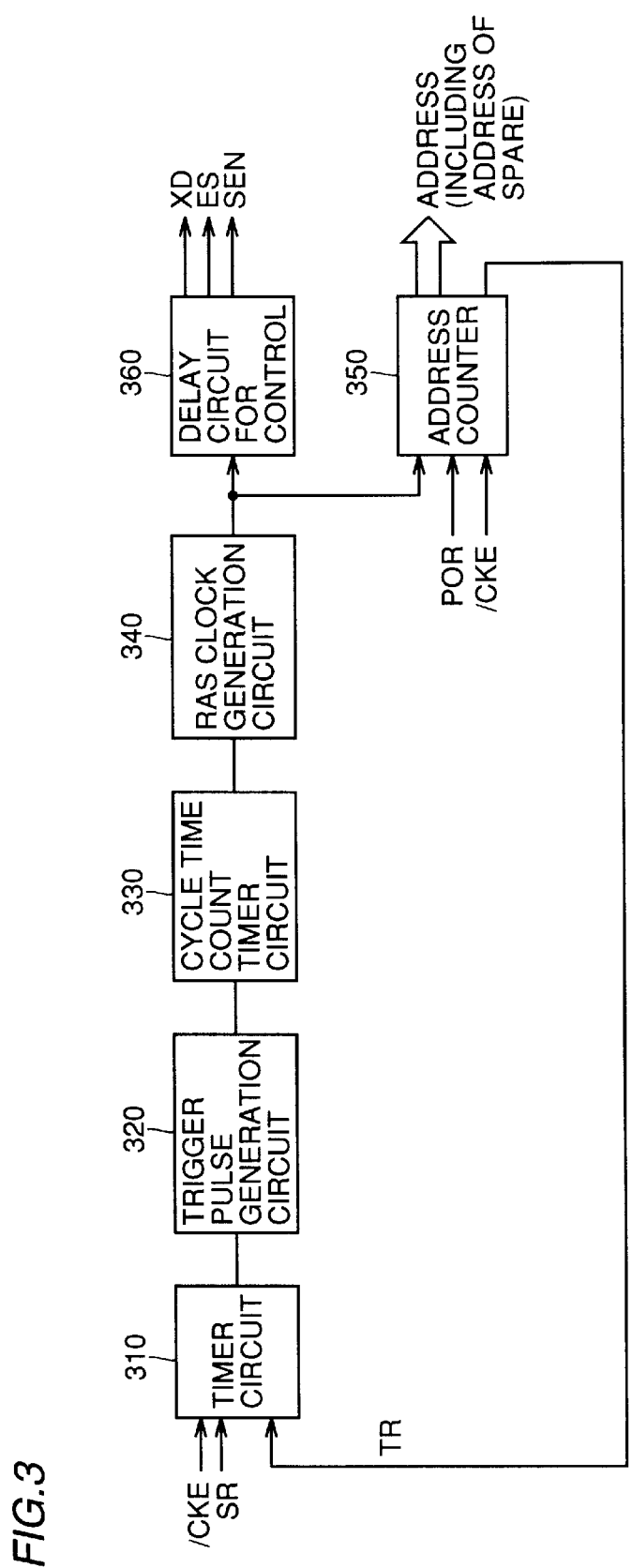
FIG. 3 is a block diagram showing a structure of a self refresh control circuit of FIG. 1.

Referring to the block diagram of FIG. 3, self refresh control circuit SRC includes a timer circuit 310, a trigger pulse generation circuit 320, a cycle time count timer circuit 330, a RAS clock generation circuit 340, an address counter 350, and a delay circuit 360 for control. Timer circuit 310 counts a predetermined time in response to inverted signal /CKE of clock enable signal CKE, self refresh set signal SR from mode decoder 2 shown in FIG. 1, and a timer reset signal TR from address counter 350. Since timer circuit 310 is formed of a transistor of a high threshold value, leakage current during operation is small. Trigger pulse generation circuit 320 generates a trigger pulse signal at the end of measurement of the predetermined time by timer circuit 310. Cycle time count timer circuit 330 generates a cyclic pulse signal for every predetermined time in response to a trigger pulse signal from trigger pulse generation circuit 320. RAS clock generation circuit 340 generates a RAS clock signal in response to a cyclic pulse signal. Address counter 350 sequentially increments the address in response to the RAS clock signal to output the incremented address as a refresh address signal, and generates a timer reset signal TR when one round of the address is completed. The address is reset by a power on reset signal POR when the power is turned on or by signal /CKE which is an inverted version of the clock enable signal. Delay circuit 360 for control delays the RAS control signal to generate a word line activation signal XD, an equalize signal ES, and a sense amplifier activation signal SEN.

Figure 4:
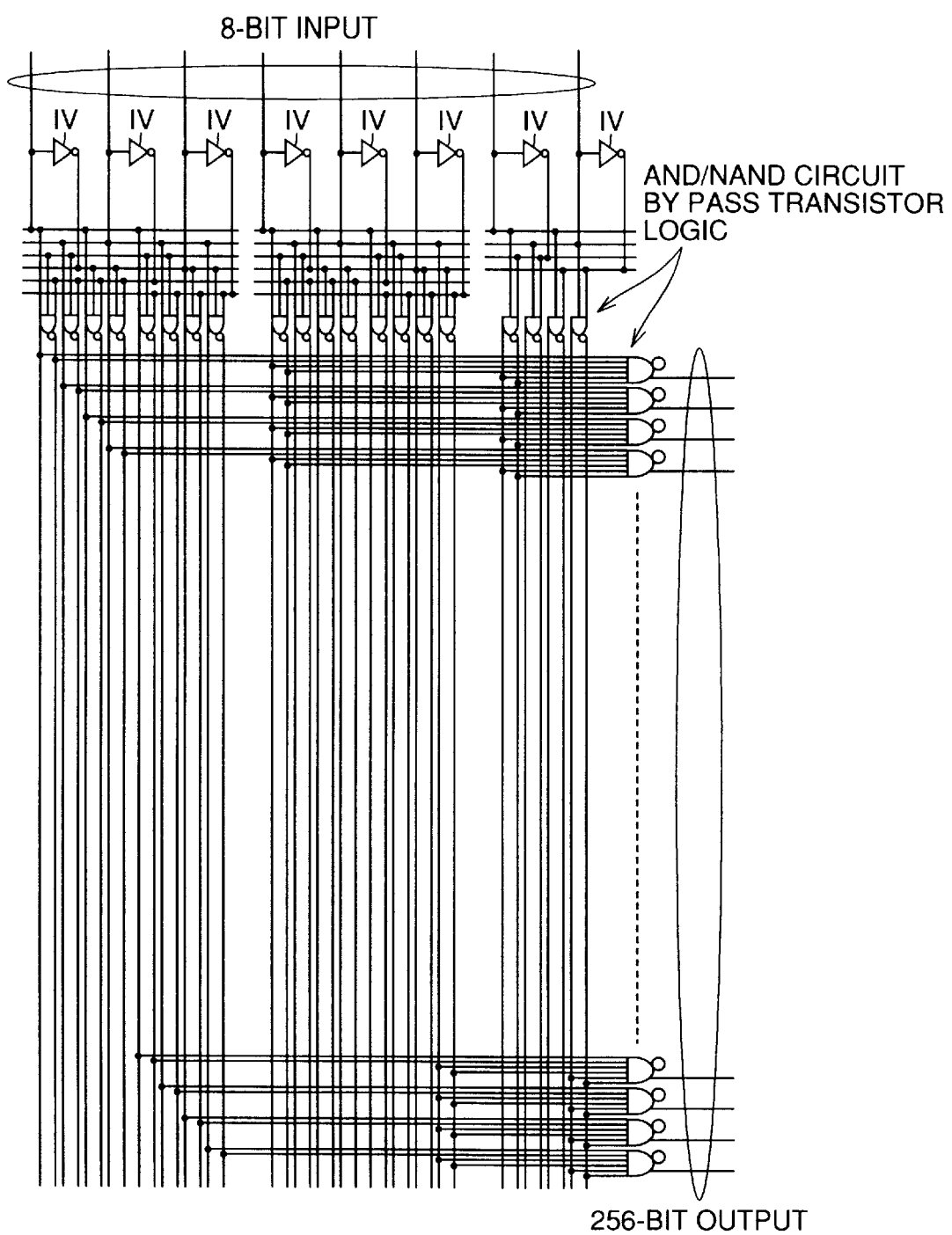
FIG. 4 is a block diagram showing a structure of a predecoder of FIG. 1.
Figure 5:
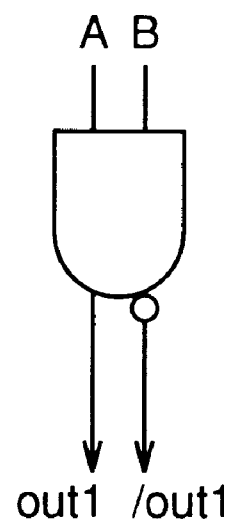
FIG. 5 shows an example of a pass transistor logic circuit of FIG. 4.
Figure 6:
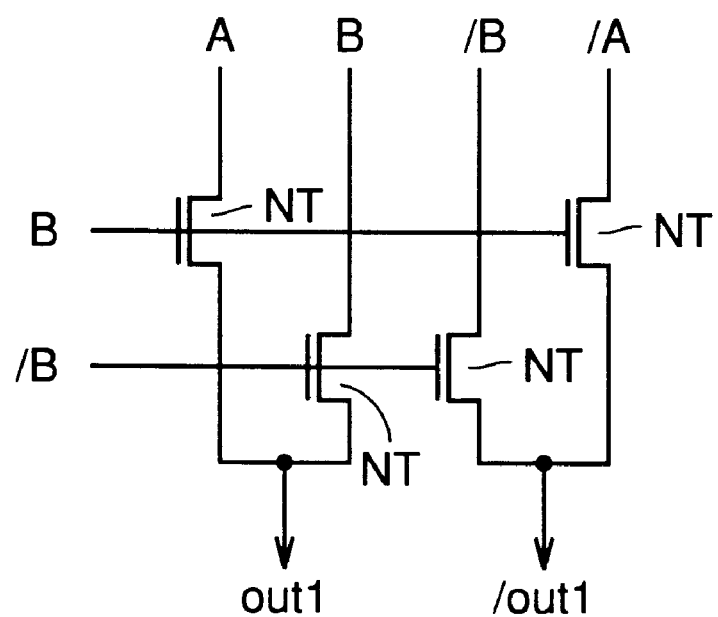
FIG. 6 is a circuit diagram showing a structure of the pass transistor logic circuit of FIG. 5.

Referring to block diagram of FIG. 4, predecoder PD is formed of an inverter IV and a pass transistor logic. FIG. 4 shows an example of 8-bit input and 256-bit output. FIG. 5 shows a pass transistor logic circuit that receives two inputs A and B and provides output signals Out1 and /Out1 out of the pass transistor logics of FIG. 4. Referring to the circuit diagram of the pass transistor logics circuit of FIG. 6, the pass transistor logic circuit provides inputs A, /A and inputs B, /B as signals Out1, /Out1 when input B is at an H level and an L level, respectively. The pass transistor logic circuit has the logic formed in a composite manner of serial connection and parallel connection of N channel MOS transistor NT, and is characterized in that the power and ground are absent in the pass transistor logic circuit. This means that no leakage current will be generated if inputs A and B towards the pass transistor logic circuit are fixed at the L level. Therefore, the threshold value of N channel MOS transistor NT forming the pass transistor logic circuit can be reduced significantly to allow increase in speed.

Figure 7:
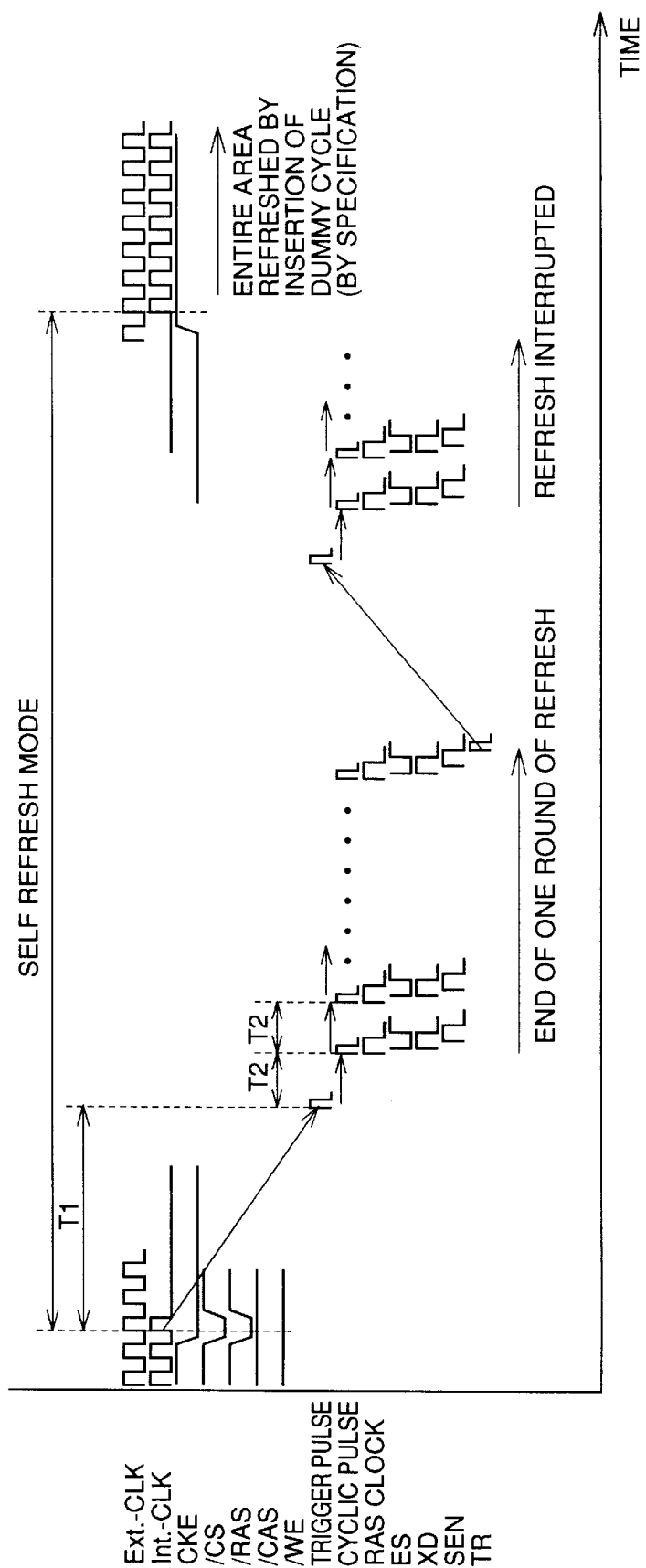
FIG. 7 is a timing chart for describing a self refresh operation by the semiconductor memory device of FIG. 1.

The self refresh operation of the semiconductor memory device of the above structure will be described here with reference to FIG. 7.

The power down mode is entered when clock enable signal CKE attains an L level. In response, address counter 350 is reset. Address counter 350 outputs the self refresh address signal of the initial value. Predecoder PD selects a word line WL corresponding to this self refresh address signal.

The self refresh mode is entered when signal /CS indicating input of a command and signal /RAS indicating input of a row related command both attain an L level at the same time. Mode decoder 2 provides an active self refresh set signal SR to timer circuit 310.

In response, timer circuit 310 initiates the count of a predetermined time T1. Trigger pulse generation circuit 320 generates a trigger pulse signal when timer circuit 310 counts the constant time T1.

In response to a trigger pulse signal, cycle time count timer circuit 330 generates a cyclic pulse signal at an elapse of a predetermined time T2. In response to an edge of this cyclic pulse signal, delay circuit 360 generates an equalize signal ES. In response, the voltage between the bit lines of pair BL is equalized for memory cell array MA.

Control delay circuit 360 then generates word line activation signal XD, whereby word line WL is rendered active corresponding to the initial value of the refresh address signal selected by predecoder PD. Accordingly, the data of memory cell MC on activated word line WL is read out on bit line pair BL.

Control delay circuit 360 then generates sense amplifier activation signal SEN, whereby sense amplifier SA amplifies the data signal read out on bit line pair BL. Although a transistor of a low threshold value is used for the sense amplifier in order to reduce the amplify time by the sense amplifier in the normal mode, leakage current can be reduced in the self refresh mode by applying a substrate voltage that is set lower than the source potential to the transistor. Also, the current conducted to the common source line of the sense amplifier can be reduced.

The amplified data signal is written into memory cell MC again. By the above operation, refresh of memory cell MC on word line WL corresponding to the initial value of address counter 350 ends.

Then, the value of the address is incremented by address counter 350, whereby the refresh of word line WL corresponding to this address is carried out in the manner described above.

This refresh is repeated until one round of address counter 350 is completed, i.e., until the refresh for all word lines WL is completed. At the completion of one round of address counter 350, address counter 350 generates a timer reset signal TR to end the refresh operation. Then, timer circuit 310 counts time T1 until the next self refresh is initiated. Alternatively, address counter 350 and timer circuit 310 are reset when the self refresh is interrupted during the operation to exit from the self refresh mode.

By providing pins P1 and P2 receiving the power supply voltage, P channel MOS transistors PT1 and PT2, self refresh control circuit SRC and predecoder PD in the semiconductor memory device of the first embodiment, no power is supplied to circuitry 400 that is not required for a self refresh operation when in the power down mode. Therefore, current consumption can be reduced. Power supply voltage Vcc1 is supplied from pin P1 to circuitry 300 that is required for a self refresh operation. Refresh is carried out even during the power down mode by power supply voltage Vcc1, so that the data in memory cell MC is maintained.

Second Embodiment

Figure 8:
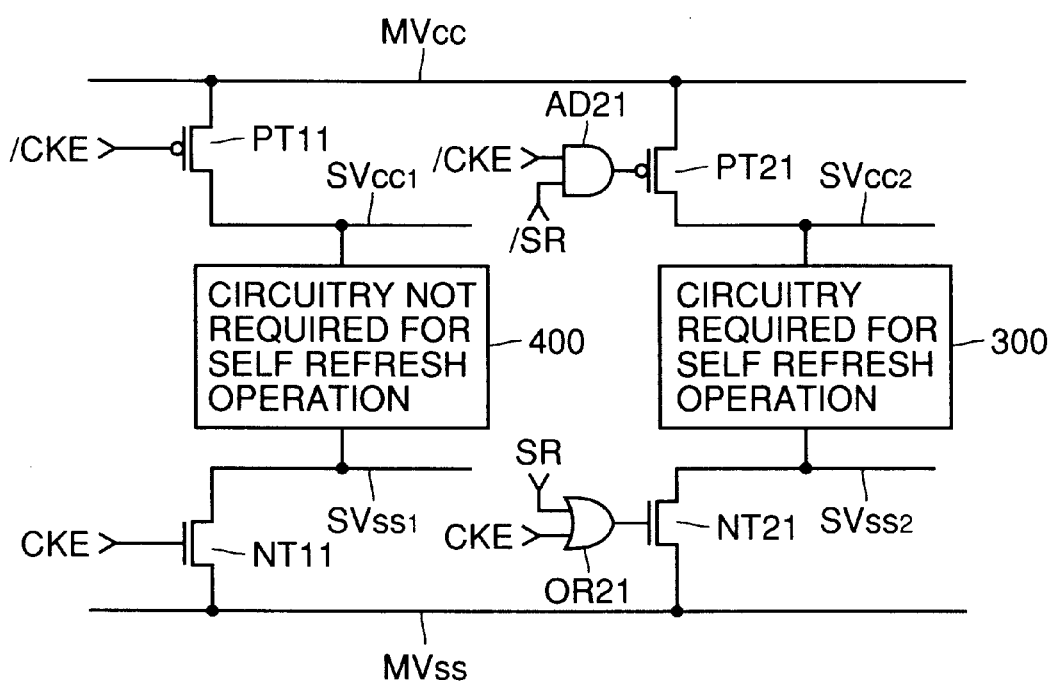
FIG. 8 is a block diagram showing a power supply system of a semiconductor memory device according to a second embodiment of the present invention.

FIG. 8 is a block diagram showing the power supply system of a semiconductor memory device according to a second embodiment of the present invention. Referring to FIG. 8, the semiconductor memory device includes a main power supply line MVcc, a main ground line MVss, sub-power supply lines SVcc1 and SVcc2, sub-ground lines SVss1 and SVss2, P channel MOS transistors PT11 and PT21, N channel MOS transistors NT11 and NT21, an AND circuit AD21, an OR circuit OR21, circuitry 300 required for a self refresh operation, and circuitry 400 not required for a self refresh operation. Main power supply line MVcc receives power supply voltage Vcc. Main ground line MVss receives ground voltage Vss. P channel MOS transistor PT11 is connected between main power supply line MVcc and sub-power supply line SVcc1 to be turned on/off in response to signal /CKE that is an inverted version of clock enable signal CKE. N channel MOS transistor NT11 is connected between main ground line MVss and sub-ground line SVss1 to be turned on/off in response to clock enable signal CKE. AND circuit AD21 provides the AND of inverted clock enable signal /CKE and signal /SR which is the inverted version of the self refresh set signal. P channel MOS transistor PT21 is connected between main power supply line MVcc and sub-power supply line SVcc2 to be turned on/off in response to the output of AND circuit AD21. OR circuit OR21 provides the OR of clock enable signal CKE and self refresh set signal SR. N channel MOS transistor NT21 is connected between main ground line MVss and sub-ground line SVss to be turned on/off in response to the output of OR circuit OR21.

Similar to the first embodiment, circuitry 300 required for a self refresh operation includes self refresh control circuit SRC, predecoder PD, and memory banks BANK0–BANK7. Circuitry 400 not required for a self refresh operation includes logic unit 100, control circuit generation circuit 26, mode decoder 2, mode register 16, row address latch 8, column address latch 12, bank address latch 18, data conversion unit 22, burst address counter 28, bank decoder 20, row predecoder 10 and column predecoder 14.

Circuitry 400 not required for a self refresh operation includes a logic circuit that has its output fixed to an L or H level when in the power down mode. The logic circuit that outputs a signal of an L level when in the power down mode has its power supply node connected to sub-power supply line SVcc1 and its ground node connected to main ground line MVss. The logic circuit that provides a signal of an H level when in the power down mode has its power supply node connected to main power supply line MVcc and its ground node connected to sub-ground line SVss1.

Circuitry 300 that is required for a self refresh operation includes a logic circuit that has the output fixed to an L or H level when a self refresh operation is not carried out during a power down mode. The logic circuit that provides a signal of an L level when self refresh is not carried out during a power down mode has its power supply node connected to sub-power supply line SVcc2 and its ground node connected to main ground line MVss. The logic circuit that provides a signal of an H level when a self refresh operation is carried out during a power down mode has its power supply node connected to main power supply line MVcc and its ground node connected to sub-ground line SVss2.

For example, address counter 350 shown in FIG. 3 has its status determined by inverted clock enable signal /CKE or power on reset signal POR at the stage prior to detection of the time by timer circuit 310, i.e., when a self refresh operation is not carried out in a power down mode. Therefore, the logic circuit that outputs a signal of an L level during this period has its power supply node connected to sub-power supply line SVcc2 and the ground node connected to main ground line MVss. The logic circuit that provides a signal of an H level during this period has its power supply node connected to main power supply line MVcc and its ground node connected to sub-ground line SVss2. By this hierarchical power source structure, leakage current can be reduced when the circuit is formed of a transistor of a low threshold value.

An operation of the semiconductor memory device of the above structure will be described hereinafter.

The normal mode is entered when clock enable signal CKE attains an H level. P channel MOS transistor PT11 and N channel MOS transistor NT11 are turned on. In response, connection is established between main ground line MVcc and sub-power supply line SVcc1 and between main power supply line MVss and sub-ground line SVss1. Power supply voltage and ground voltage are supplied to circuitry 400 not required for a self refresh operation through sub-power supply line SVcc1 and sub-ground line SVss1. Also, P channel MOS transistor PT21 and N channel MOS transistor NT21 are turned on. In response, connection is established between main power supply line MVcc and sub-power supply line SVcc2 and between main ground line MVss and sub-ground line SVss2. Power supply voltage and ground voltage are supplied to circuitry 300 required for a self refresh operation through sub-power supply line SVcc2 and sub-ground line SVss2. As a result, the semiconductor memory device carries out a normal operation.

The power down mode is entered when clock enable signal CKE attains an L level. P channel MOS transistor PT11 and N channel MOS transistor NT11 are turned off. Accordingly, leakage current flowing to circuitry 400 that is not required for a self refresh operation is reduced.

When a self refresh operation is not carried out in a power down mode, clock enable signal CKE is at an L level and self refresh set signal SR is at an L level. Here, P channel MOS transistor PT21 and N channel MOS transistor NT21 are turned off. Thus, the leakage current flowing to circuitry 300 required for a self refresh operation is reduced.

When a self refresh operation is carried out, clock enable signal CKE attains an L level and self refresh set signal SR attains an H level. Here, P channel MOS transistor PT21 and N channel MOS transistor NT21 are turned on. Accordingly, power supply voltage and ground voltage are supplied to circuitry 300 required for a self refresh operation through sub-power supply line SVcc2 and sub-ground line SVss2 for a self refresh operation.

In the second embodiment, main power supply line MVcc, sub-power supply lines SVcc1 and SVcc2, main ground line MVss, sub-ground lines SVss1 and SVss2, P channel MOS transistors PT11 and PT21, and N channel MOS transistors NT11 and NT21 are provided to implement a hierarchical power source structure. Therefore, leakage current flowing to circuitry 400 that is not required for a self refresh operation when in a power down mode can be reduced. Also, leakage current can be reduced flowing to circuitry 300 required for a self refresh operation when a self refresh operation is not carried out in a power down mode.

Third Embodiment

In a self refresh mode, high speed sensing as in the operation of a normal mode is not required. Focusing on this fact, the third embodiment is directed to reduce current consumption in the power down mode.

The semiconductor memory device of the third embodiment has a structure basically similar to that of the semiconductor memory device of FIG. 1 except for memory cell array MA.

Figure 9:
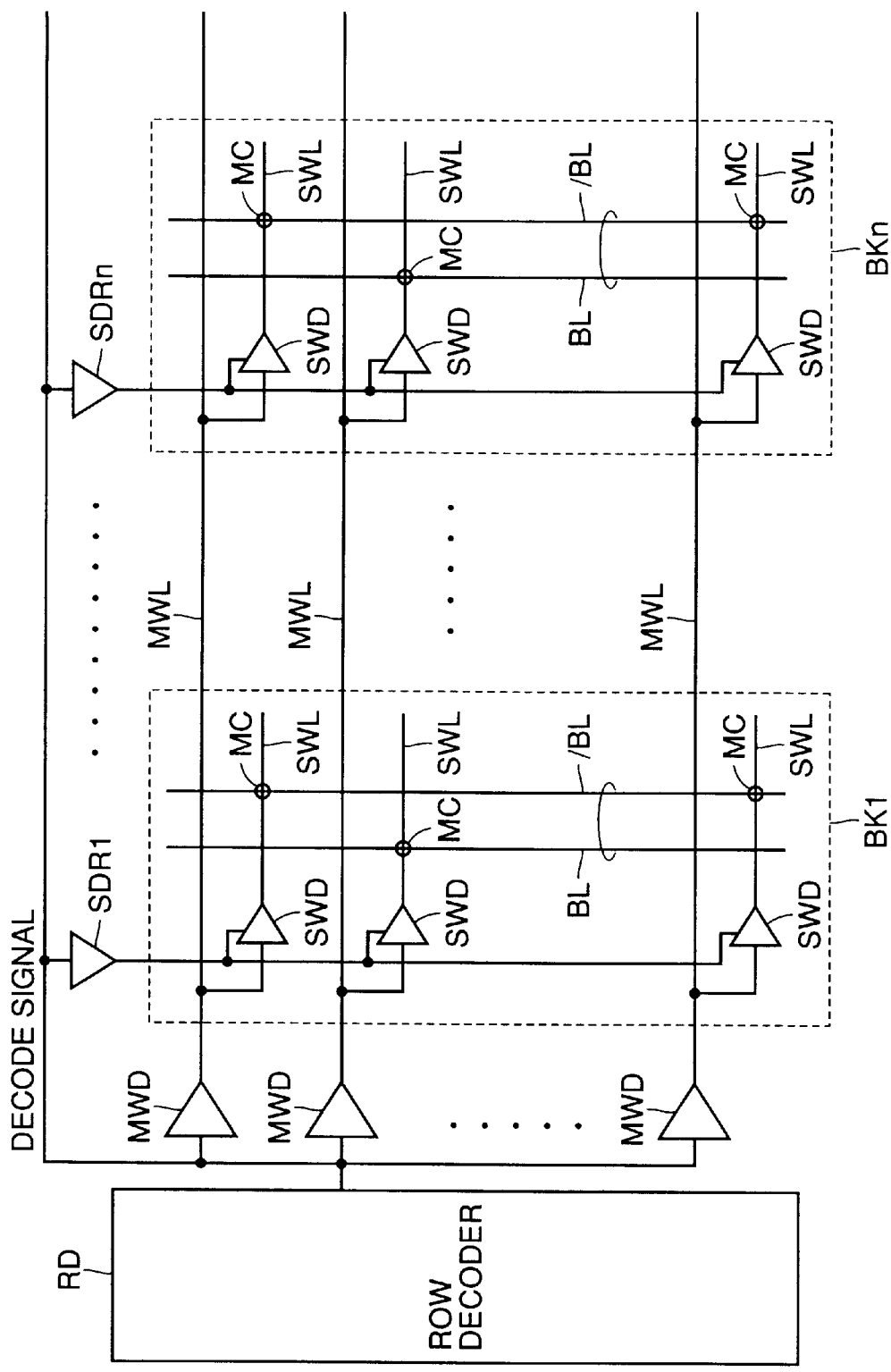
FIG. 9 is a block diagram showing a structure of a memory cell array unit provided corresponding to each memory bank in a semiconductor memory device according to a third embodiment of the present invention.

FIG. 9 is a block diagram showing a structure of a memory cell array portion provided corresponding to each of memory banks BANK0–BANK7 in the semiconductor memory device of the third embodiment. Referring to FIG. 9, the memory cell array portion includes a plurality of main word lines MWL arranged in rows, a plurality of main word drivers MWD provided corresponding to the plurality of main word lines MWL, n sub decode circuits SDR1–SDRn, and n blocks BK1–BKn. The plurality of main word lines MWL are arranged in rows. Main word driver MWL selects a main word line MWL in response to a corresponding decode signal from row decoder RD. Each of sub decode circuits SDR1–SDRn generates sub decode signals SD and /SD in response to a corresponding decode signal from row decoder RD. Each of n blocks BK1–BKn includes a plurality of memory cells MC arranged in rows and columns, a plurality of sub word lines SWL provided corresponding to the plurality of main word lines MWL, a plurality of bit line pairs BL and/BL arranged in rows, and a plurality of sub word line drivers provided corresponding to the plurality of sub word lines SWL to render a sub word line SWL active in response to sub decode signals SD, /SD and the voltage of a corresponding main word line MWL.

Figure 10:
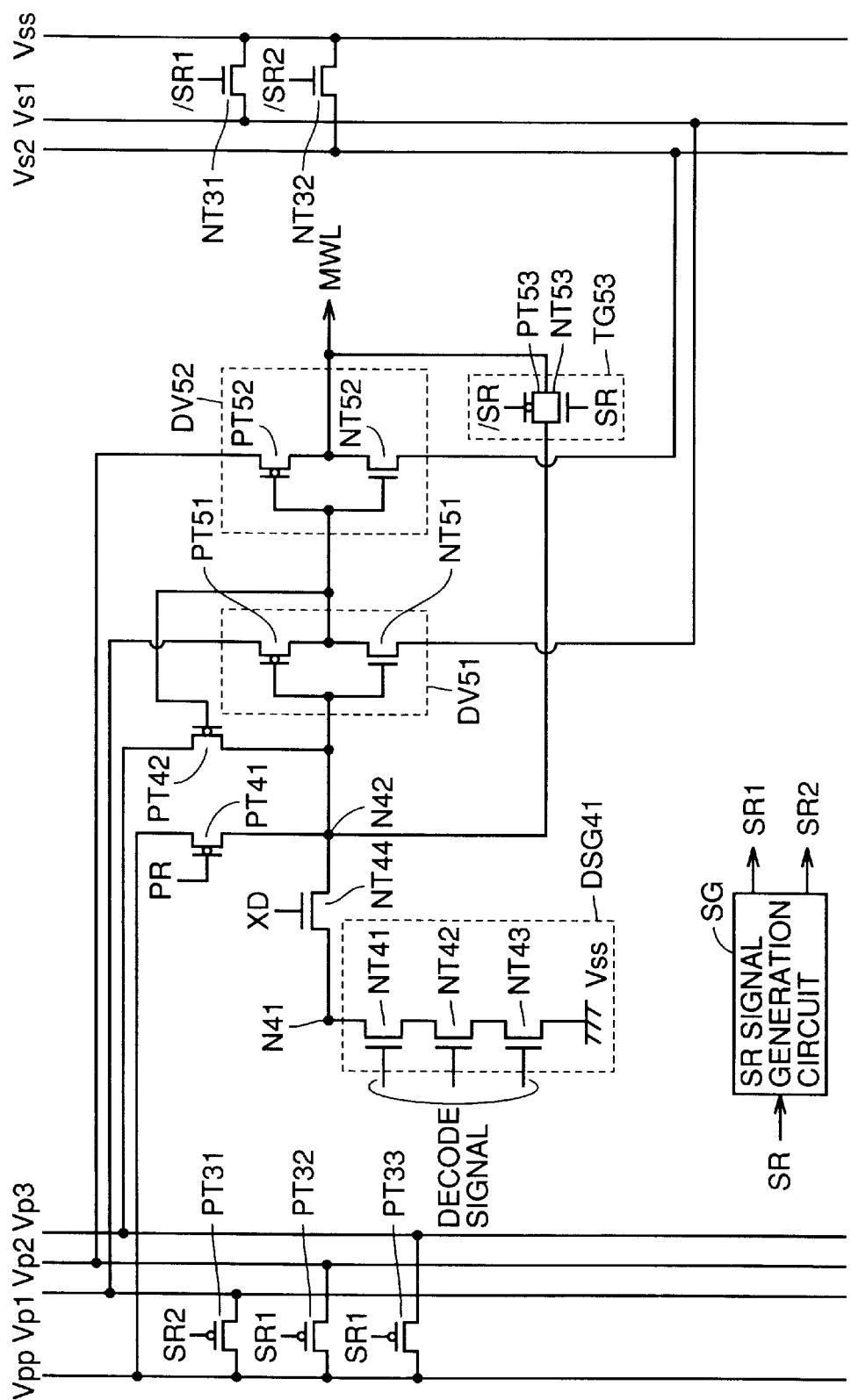
FIG. 10 shows in detail a structure of one of the plurality of main word drivers of FIG. 9.

FIG. 10 shows in further detail one of the plurality of main word drivers MWD of FIG. 9.

Although not shown in FIG. 9, the semiconductor memory device further includes a main boosted line Vpp receiving a voltage higher than the power supply voltage, sub boosted lines Vp1–Vp3, sub-ground lines Vs1 and Vs2, P channel MOS transistors PT31–PT33, N channel MOS transistors NT31 and NT32, and an SR signal generation circuit SG. SR signal generation circuit SG generates SR signals SR1 and SR2 in response to self refresh set signal SR. P channel MOS transistor PT31 is connected between main boosted line Vpp and sub boosted line Vp1 to be turned on/off in response to SR signal SR2. P channel MOS transistor PT32 is connected between main boosted line Vpp and sub boosted line Vp2 to be turned on/off in response to SR signal SR1. P channel MOS transistor PT33 is connected between main boosted line Vpp and sub boosted line Vp3 to be turned on/off in response to SR signal SR1. N channel MOS transistor NT31 is connected between ground line Vss and sub-ground line Vs1 to be turned on/off in response to signal /SR1. N channel MOS transistor NT32 is connected between ground line Vss and sub-ground line Vs2 to be turned on/off in response to signal /SR2.

Main word driver MWD includes a drive signal generation circuit DSG41, P channel MOS transistors PT41 and PT42, an N channel MOS transistor NT44, drivers DV51 and DV52, and a transfer gate TG53. Drive signal generation circuit DSG41 includes N channel MOS transistors NT41–NT43 connected in series between a node N41 and a ground node Vss. N channel MOS transistors NT41–NT43 receive a decode signal at the gate from row decoder RD. N channel MOS transistor NT44 is connected between nodes N41 and N42 to be turned on/off in response to word line activation signal XD from control delay circuit 360 of FIG. 3. P channel MOS transistor PT41 is connected between main boosted line Vpp and node N42 to be turned on/off in response to precharge signal PR. P channel MOS transistor PT42 is connected between sub boosted line Vp3 and node N42 to receive the output of driver DV51 at its gate. Drivers DV51 and DV52 are connected in series between node N42 and main word line MWL. Driver DV51 includes a P channel MOS transistor PT51 and an N channel MOS transistor NT51 connected in series between sub boosted line Vp1 and sub-ground line Vs1 to receive the voltage of node N42 at the gate. Driver DV52 includes a P channel MOS transistor PT52 and an N channel MOS transistor NT52 connected in series between sub boosted line Vp2 and sub-ground line Vs2 to receive the output of driver DV51 at the gate. Transfer gate TG53 is connected in parallel with drivers DV51 and DV52, between node N42 and main word line MWL. Transfer gate TG53 includes a P channel MOS transistor PT53 and an N channel MOS transistor NT53. P channel MOS transistor PT53 has a threshold value higher than that of P channel MOS transistors PT51 and PT52, and receives an inverted self refresh set signal/SR at its gate. N channel MOS transistor NT53 has a threshold value higher than that of N channel MOS transistors NT51 and NT53 to receive self refresh set signal SR at its gate.

Figure 11:
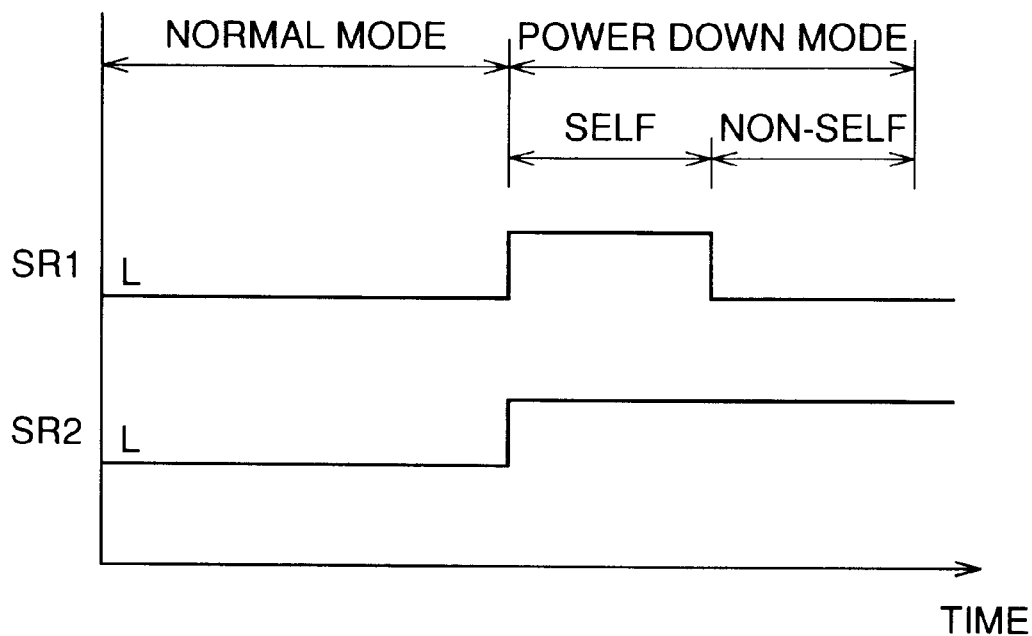
FIG. 11 is a timing chart for describing an operation of the main word driver of FIG. 10.

The operation of main word driver MWL of the above structure will be described hereinafter with reference to FIG. 11.

(1) When in normal mode

Signals SR1 and SR2 both attain an L level. Therefore, P channel MOS transistors PT31–PT33 and N channel MOS transistors NT31 and NT32 are all turned on. P channel MOS transistor PT53 and N channel MOS transistor NT53 are turned off since self refresh set signal SR is at an L level.

Node N42 is precharged to an H level in advance by setting the precharge signal at an L level for a predetermined time. Accordingly, main word line MWL is at H level.

All N channel MOS transistors NT41–NT43 are turned on only in the main word line driver out of the plurality of main word line drivers WML shown in FIG. 9 that corresponds to a decode signal from row decoder RD. As a result, the voltage of node N42 attains an L level. In response to main word activation signal XD, N channel MOS transistor NT44 is turned on. The voltage of node N42 is driven to an L level from an H level. In response, main word line MWL is pulled down to an L level from an H level. Thus, the voltage of main word line MWL corresponding to the decode signal from row decoder RD is driven to an L level from an H level by drivers DV51 and DV52.

(2) When in power down mode (a) When self refresh is not carried out

Signal SR1 attains an L level, whereas signal SR2 attains an H level. Therefore, P channel MOS transistors PT32, PT33 and N channel MOS transistor NT31 are turned on. P channel MOS transistor PT31 and N channel MOS transistor NT32 are turned off. P channel MOS transistor PT53 and N channel MOS transistor NT53 are turned off since self refresh set signal SR is at an L level.

Node N42 is precharged to an H level (Vpp level) in advance by setting the precharge signal at an L level for a predetermined time. Accordingly, the output of driver DV51 attains an L level, and the output of driver DV52, i.e., main word line MWL, attains an H level (Vpp level). These outputs are fixed when self refresh is not carried out.

Focusing on driver DV51 here, the leakage current flowing towards P channel MOS transistor PT51 is reduced since P channel MOS transistor PT31 is off. Similarly, the leakage current flowing towards N channel MOS transistor NT52 is reduced since N channel MOS transistor NT32 is off for driver DV52.

(b) When self refresh is carried out

Signals SR1 and SR2 both attain an H level. Therefore, P channel MOS transistors PT31–PT33 and N channel MOS transistors NT31 and NT32 are all turned off. Therefore, supply of a voltage toward drivers DV51 and DV52 is suppressed. In other words, current is not consumed at drivers DV51 and DV52. Since self refresh set signal SR is at an H level, P channel MOS transistor PT53 and N channel MOS transistor NT53 are turned on.

Node N42 is precharged to an H level (Vpp level) in advance by setting the precharge signal at an L level for a predetermined time. Accordingly, main word line MWL attains an H level (Vpp level).

Then, N channel MOS transistors NT41–NT43 are all turned on only in the main word line driver out of the plurality of main word line drivers WMD shown in FIG. 9 that corresponds to the decode signal from row decoder RD. Therefore, the voltage of node N41 attains an L level. Also, N channel MOS transistor NT44 is turned on in response to main word line activation signal XD. The voltage of node N42 is driven to an L level from an H level (Vpp level). Furthermore, main word line MWL is driven to an L level from an H level (Vpp level) via transfer gate TG53. Thus, the voltage of main word line MWL corresponding to the decode signal from row decoder RD is driven to an L level from an H level (Vpp level) by transfer gate TG53.

Since a drive signal generation circuit DSG41 is provided common to the normal mode and the power down mode in main word line driver WMD, circuit complexity can be reduced.

In contrast, although main word line MWL is driven by drivers DV51 and DV52 in a normal mode, drivers DV51 and DV52 are disconnected from boosted line Vpp and ground line Vss in the refresh operation during a power down mode. Therefore, main word line MWL is driven by transfer gate TG53. Thus, current consumption in the power down mode is reduced since no current is consumed at drivers DV51 and DV52.

The leakage current during operation is low since P channel MOS transistor PT53 and N channel MOS transistor NT53 have a high threshold value.

By increasing the delay time for the activating word line and reducing the size of the activated transistor, the noise can be reduced in addition to allow increase of the margin in sensing.

Figure 12:
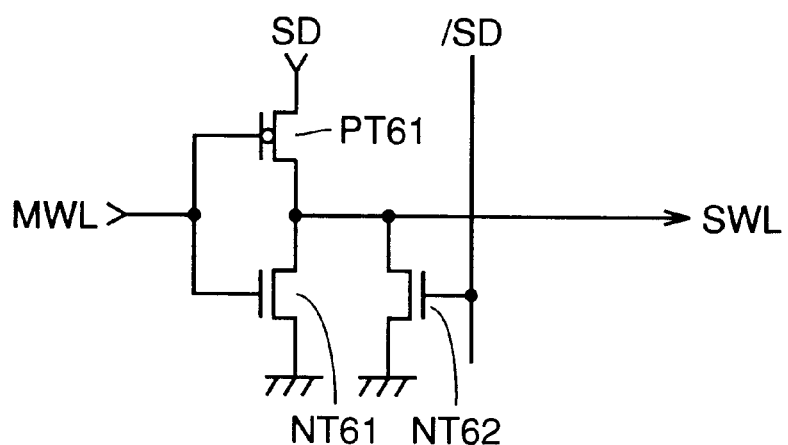
FIG. 12 is a circuit diagram showing a structure of a sub word driver of FIG. 9.

Referring to the circuit diagram of sub word driver SWD of FIG. 12, sub word driver SWD includes a P channel MOS transistor PT61 and an N channel MOS transistor NT61 connected in series between a sub decode signal line that receives a sub decode signal SD and ground node Vss to receive the voltage on main word line MWL at the gate, and an N channel MOS transistor NT62 connected between sub word line SWL and ground node Vss to receive a sub decode signal /SD at its gate.

The circuit structure of sub word driver SWD does not change between the normal mode and the power down mode, provided that the level of sub decode signal SD is set lower than the VPP level when in a self refresh mode. Accordingly, the leakage current of P channel MOS transistor PT61 of nonselected sub word driver SWD can be reduced.

Figure 13:
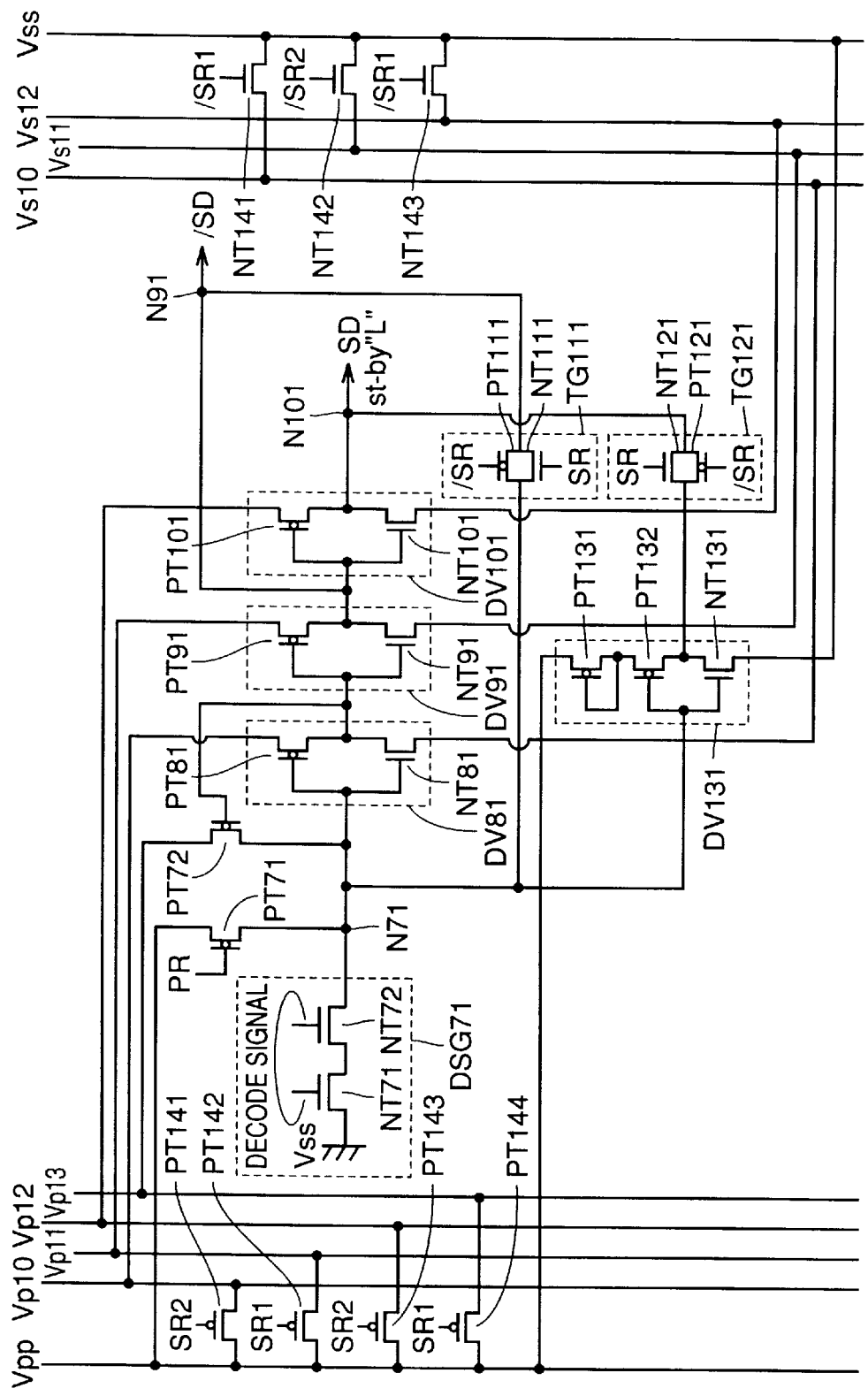
FIG. 13 shows in detail a structure of the sub decode driver of FIG. 9.

FIG. 13 shows in detail a structure of sub decode driver SDRi (i=1-n) of FIG. 9.

Although not shown in FIG. 9, the semiconductor memory device further includes sub boosted lines Vp10–Vp13, sub-ground lines Vs10–Vs12, P channel MOS transistors PT141–PT144, and N channel MOS transistors NT141–NT143. P channel MOS transistor PT141 is connected between main boosted line Vpp and sub boosted line Vp10 to be turned on/off in response to signal SR2. P channel MOS transistor PT142 is connected between main boosted line Vpp and sub boosted line Vp11 to be turned on/off in response to signal SR1. P channel MOS transistor PT143 is connected between main boosted line Vpp and sub boosted line Vp12 to be turned on/off in response to signal SR2. P channel MOS transistor PT144 is connected between main boosted line Vpp and sub boosted line Vp13 to be turned on/off in response to signal SR1. N channel MOS transistor NT141 is connected between ground line Vss and sub-ground line Vs10 to be turned on/off in response to signal /SR1. N channel MOS transistor NT142 is connected between ground line Vss and sub-ground line Vs11 to be turned on/off in response to signal /SR2. N channel MOS transistor NT143 is connected between ground line Vss and sub-ground line Vs12 to be turned on/off in response to signal /SR1.

Sub decode driver SDRi includes a drive signal generation circuit DSG71, P channel MOS transistors PT71 and PT72, drivers DV81, DV91, DV101 and DV131, and transfer gates TG111 and TG121. Drive signal generation circuit DSG71 includes N channel MOS transistors NT71 and NT72 connected in series between node N71 and ground node Vss. N channel MOS transistors NT71 and NT72 receive the decode signal from row decoder RD at the gate. P channel MOS transistor PT71 is connected between main boosted line Vpp and node N71 to be turned on/off in response to precharge signal PR. P channel MOS transistor PT72 is connected between sub boosted line Vp13 and node N71 to receive the output of driver DV81 at its gate. Drivers DV81, DV91 and DV101 are connected in series between nodes N71 and N101. Driver DV81 includes a P channel MOS transistor PT81 and an N channel MOS transistor NT81 connected in series between sub boosted line Vp10 and sub-ground line Vs10 to receive the voltage of node N71 at the gate. Driver DV91 includes a P channel MOS transistor PT91 and an N channel MOS transistor NT91 connected in series between sub boosted line Vp11 and sub-ground line Vs11 to receive the output of driver DV71 at the gate. Driver DV101 includes a P channel MOS transistor PT101 and an N channel MOS transistor NT101 connected in series between sub boosted line Vp12 and sub-ground line Vs12 to receive the output of driver DV91 at the gate. Driver DV131 includes a P channel MOS transistor PT132 and an N channel MOS transistor NT131 connected in series between main boosted line Vpp and ground line Vss to receive the voltage of node N71 at the gate, and a P channel MOS transistor PT131 connected between main boosted line Vpp and P channel MOS transistor PT132, and its gate connected to its drain. Transfer gate TG111 is connected in parallel with drivers DV81 and DV91, between nodes N71 and N91. Transfer gate TG111 includes a P channel MOS transistor PT111 and an N channel MOS transistor NT111. P channel MOS transistor PT111 has a higher threshold value and a smaller size than P channel MOS transistors PT81, PT91 and PT101, and receives an inverted self refresh set signal /SR at its gate. N channel MOS transistor NT111 has a higher threshold value and a smaller size than N channel MOS transistors NT81, NT91 and NT101 to receive self refresh set signal SR at its gate. Transfer gate TG121 is connected in parallel with drivers DV81, DV91 and DV1O1 between nodes N71 and N101. Transfer gate TG121 includes a P channel MOS transistor PT121 and an N channel MOS transistor NT121. P channel MOS transistor PT121 has a higher threshold value and a smaller size than P channel MOS transistors PT81, PT91 and PT101 to receive an inverted self refresh set signal /SR at its gate. N channel MOS transistor NT121 has a higher threshold value and a smaller size than N channel MOS transistors NT81, NT91 and NT101 to receive self refresh set signal SR at its gate.

The operation of sub decode driver SDRi of the above structure will be described with reference to FIG. 11 again.

(1) When in normal mode

Signals SR1 and SR2 both attain an L level. P channel MOS transistors PT141–PT144 and N channel MOS transistors NT141 and NT143 are all turned on. P channel MOS transistors PT111 and PT121. and N channel MOS transistors NT111 and NT121 are turned off since self refresh set signal SR is at an L level.

Node N71 is precharged to an H level (Vpp level) in advance by setting the precharge signal at an L level for a predetermined time. Accordingly, node N91 attains an at H level (Vpp level). The voltage of node N91 corresponds to decode signal /SD. Node N1O1 attains an L level. The voltage of node N101 corresponds to sub decode signal SD.

Then, N channel MOS transistors NT71 and NT72 are both turned on only in a sub decode driver SDRi out of sub decode drivers SDRi (i=1-n) of FIG. 9 corresponding to the decode signal from row decoder RD. The voltage of node N71 is driven to an L level. In response, sub decode signal /SD is pulled down to an L level from an H level. Sub decode signal SD is driven to an H level from an L level. Thus, sub decode signal /SD is driven by drivers DV81, DV91 and DV101 to an L level from an H level and sub decode signal SD is driven to an H level from an L level corresponding to the decode signal from row decoder RD.

(2) When in a power down mode (a) When self refresh is not carried out

Signal SR1 attains an L level and signal SR2 attains an H level. P channel MOS transistors PT142 and PT144 and N channel MOS transistors NT141 and NT143 are turned on. P channel MOS transistors PT141 and PT143 and N channel MOS transistor NT142 are turned off. In contrast, P channel MOS transistors PT111 and PT121 and N channel MOS transistors NT11 and NT121 are turned off since self refresh set signal SR is at an L level.

Node N71 is precharged to an H level (Vpp level) in advance by setting the precharge signal at an L level for a predetermined time. Accordingly, the outputs of drivers DV81, DV91, and DV101 attain an L level, an H level and an L level, respectively. These outputs are fixed when self refresh is not carried out.

Focusing on driver DV81, DV101, the leakage current flowing to P channel MOS transistors PT81, PT101 is reduced since P channel MOS transistor PT141, PT143 are off. Similarly, the leakage current flowing to N channel MOS transistor NT91 is reduced since N channel MOS transistor NT142 is off for driver DV91.

(b) When self refresh is carried out

Signals SR1 and SR2 both attain an H level. Therefore, P channel MOS transistors PT141–PT144 and N channel MOS transistors NT141–NT143 are all turned off. No voltage is supplied to drivers DV81, DV91 and DV101. In other words, current will not be consumed at drivers DV81, DV91 and DV101. In contrast, P channel MOS transistors PT111 and PT121 and N channel MOS transistors NT111 and NT121 are turned on since self refresh set signal SR is at an H level.

Node N71 is precharged to an H level in advance by setting the precharge signal at an L level for a predetermined time. Node N91 attains an H level via transfer gate TG111. The voltage of node N71 is inverted by driver DV131, and further conveyed via transfer gate TG121. As a result, node N101 attains an L level.

Then, N channel MOS transistors NT71 and NT72 are both turned on in only a sub decode driver SDRi corresponding to the decode signal from row decoder RD out of sub decode drivers SDRi (i=1-n) shown in FIG. 9. Node N71 is pulled down to an L level from an H level. Node N91 is driven to an L level from an H level via transfer gate TG111. Also, node N101 is driven to an H level from an L level through driver DV131 and transfer gate TG121. Thus, sub decode signal /SD from a sub decoder SDRi corresponding to the decode signal from row decoder RD is driven to an L level from an H level by transfer gate TG111. Also, sub decode signal SD is driven to an L level from an H level by driver DV131 and transfer gate TG121.

Since drive signal generation circuit DSG71 is provided in sub decode circuit SDRi common for both the normal mode and the power down mode, the circuit complexity can be reduced than the case where a separate drive signal generation circuit is provided.

In an normal mode, sub decode signals SD and /SD are driven by drivers DV81, DV91 and DV101. In a refresh operation during power down mode, drivers DV81, DV91 and DV101 are disconnected from boosted line Vpp and ground line Vs, so that sub decode signal /SD is driven by transfer gate TG111 and sub decode signal SD is driven by driver DV131 and transfer gate TG121. Therefore, no current will be consumed by drivers DV81, DV91 and DV101. Current consumption in the power down mode is reduced.

Since P channel MOS transistors PT111 and PT121 and N channel MOS transistors NT111 and NT121 have a high threshold value, the leakage current during operation is small.

By increasing the delay time of activation of the SD signal and reducing the size of the transistor of activation, the noise can be reduced and the margin increased for the sensing operation.

Figure 14:
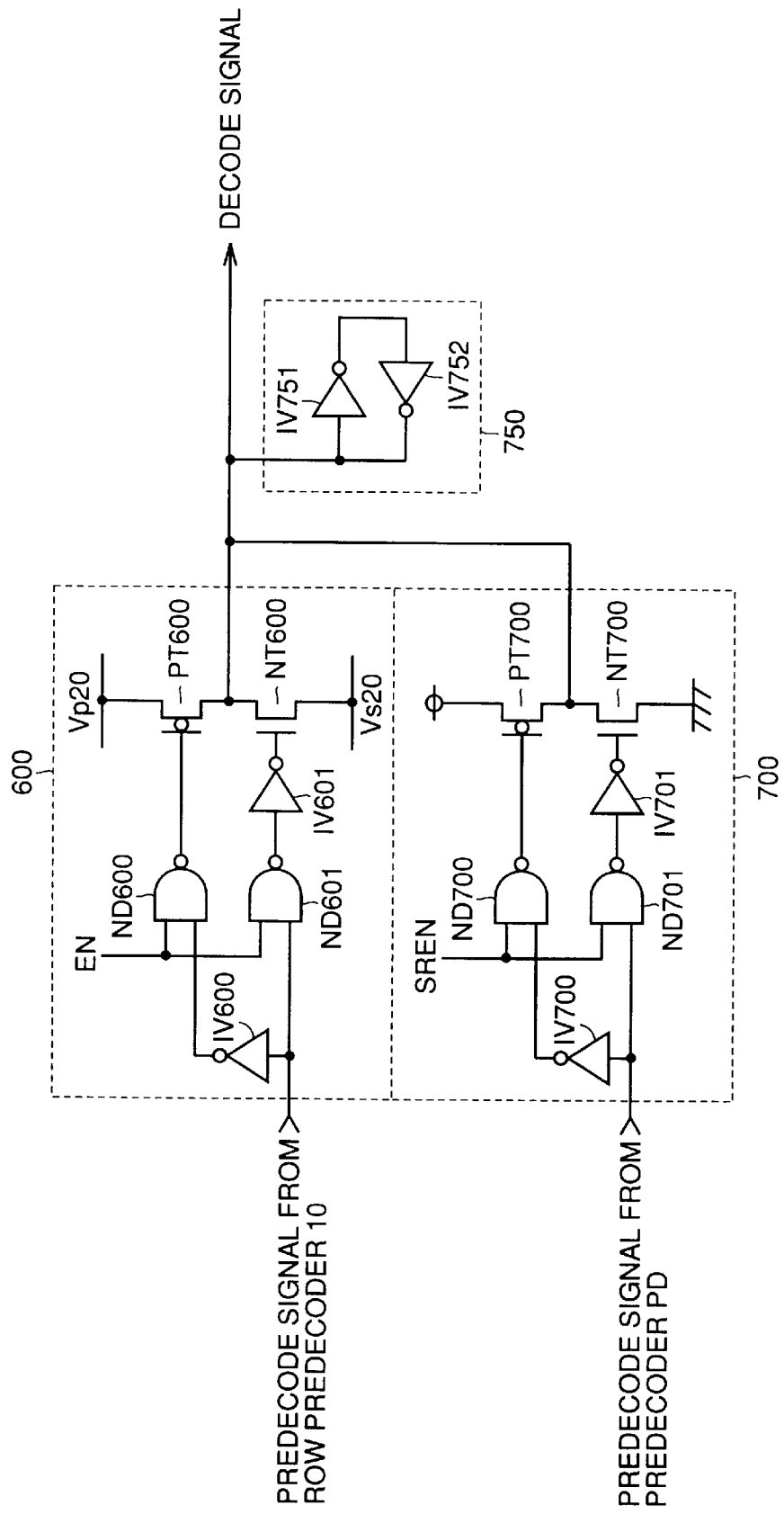
FIG. 14 is a block diagram showing a structure of a driver that provides control of a decode signal.

FIG. 14 is a block diagram showing a structure of a driver that controls the decode signal.

This driver includes circuitry 600 for driving a decode signal line in response to a predecode signal from row predecoder 10 which is the normal address control circuitry, circuitry 700 driving a decode signal line in response to a predecode signal from predecoder PD, and a latch circuit 750.

Circuitry 600 driving a decode signal according to a signal from row predecoder 10 includes inverters IV600 and IV601, NAND circuits ND600 and ND601, a P channel MOS transistor PT600, and an N channel MOS transistor NT600. Inverter IV600 inverts the predecode signal from row predecoder 10. NAND circuits ND600 provides the NAND of the output of inverter IV600 and enable signal EN. NAND circuit ND601 provides the NAND of the predecode signal from row predecoder 10 and enable signal EN. Inverter IV601 inverts the output from NAND circuits ND601. P channel MOS transistor PT600 and N channel MOS transistor NT600 are connected in series between sub boosted line Vp20 and sub-ground line Vs20. P channel MOS transistor PT600 receives the output from NAND circuit ND600 at its gate. N channel MOS transistor NT600 receives the output from inverter IV601 at its gate. The voltage at the connection node of P channel MOS transistor PT600 and N channel MOS transistor NT600 is output as a decode signal.

Circuitry 700 that drives a decode signal line in response to a predecode signal from predecoder PD includes inverters IV700 and IV701, NAND circuits ND700 and ND701, a P channel MOS transistor PT700, and an N channel MOS transistor NT700. Inverter IV700 inverts the predecode signal from predecode signal PD. NAND circuits ND700 provides the NAND of the output of inverter IV700 and a self refresh enable signal SREN. NAND circuit ND701 provides the NAND of the predecode signal from predecoder PD and self refresh enable signal SREN. Inverter IV701 inverts the output from NAND circuit ND701. P and N channel MOS transistors PT700 and NT700 are connected in series between the power supply node and the ground node. P channel MOS transistor PT700 receives the output from NAND circuit ND700 at its gate. N channel MOS transistor NT700 receives the output from inverter IV701 at its gate. The voltage at the interconnection node of P and N channel MOS transistors PT700 and NT700 is output as a decode signal.

Latch circuit 750 includes inverters IV751 and IV752 to latch the voltage of the decode signal line.

Inverters IV600, IV601 and NAND circuits ND600, ND601 in circuitry 600 are formed of transistors having a threshold value lower than that of the transistors forming inverters IV700, IV701 and NAND circuits ND700, ND701 included in circuitry 700. Inverters IV600, IV601 and NAND circuits ND600, ND601 have the hierarchical power source structure according to the principle similar to that shown in FIG. 8.

The two circuitry 600 and 700 are tri-status circuits to drive a decode signal by one circuitry in operation. More specifically, the decode signal is driven by circuitry 600 that drives a decode signal line corresponding to the signal from row predecoder 10 in a normal mode, and by circuitry 700 that drives a decode signal line in response to a predecode signal from predecoder PD when a self refresh operation is carried out in a power down mode. The circuitry differs from the normal circuitry in that it is formed of transistors of a high threshold value. Therefore, the leakage current is small. Also, noise generation is small due to the small size and small drivability.

The same applies to the equalize signal, the sense amplifier activation signal, and also to the bank signal.

A corresponding bank signal line receives the output of the address counter to show transition. The equalize signal, word line activation signal, and sense activation signal sent from the central processing circuit are input only by the bank having the corresponding bank signal activated.

The self refresh address signal forcefully drives the predecode signal to drive row decoder 10. The predecode signal line is under tri-status control. The transistors of both the pull up side and the pull down side are turned off when the signal line is not driven. The potential thereof is maintained by a latch.

Figure 15:
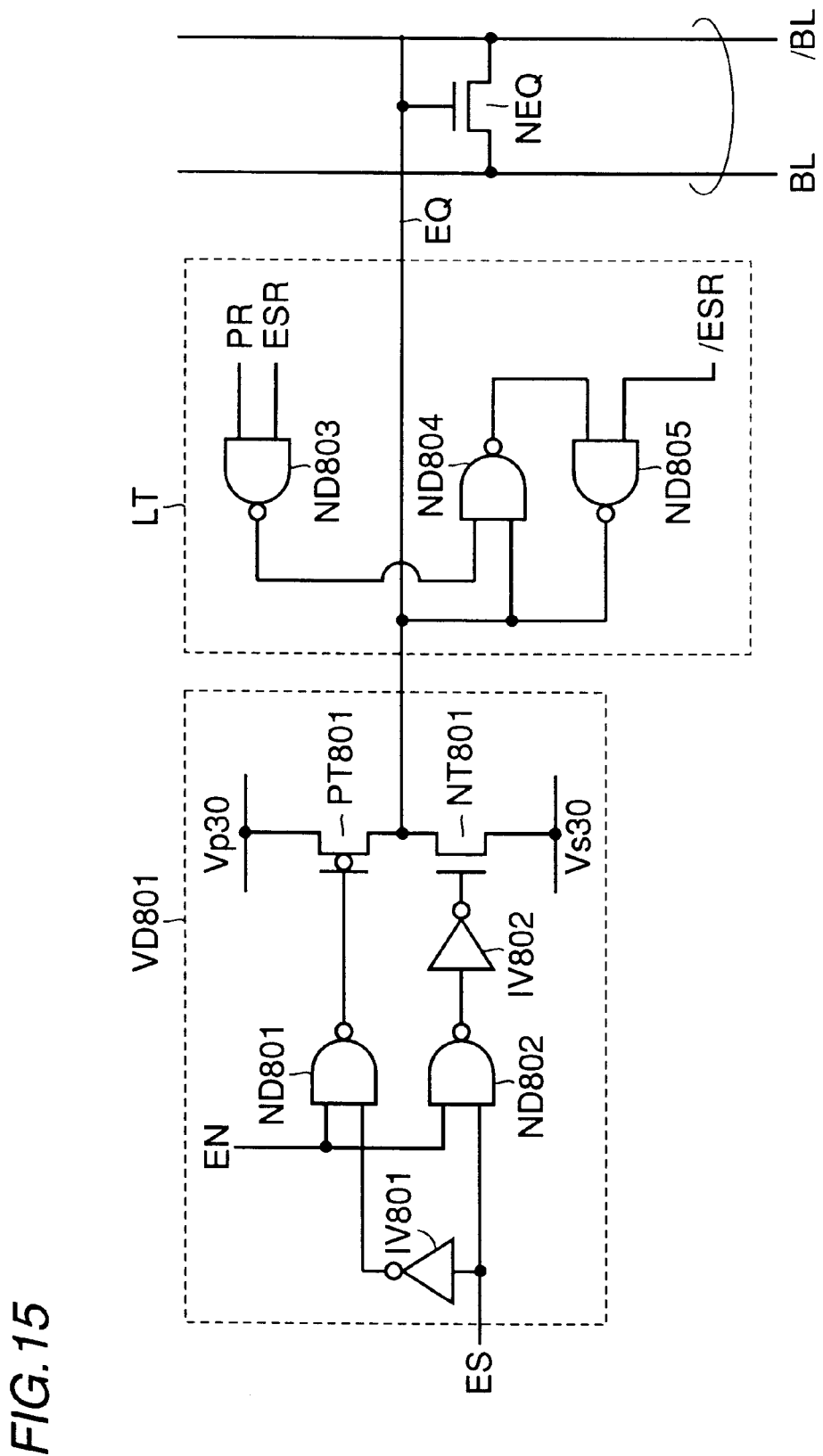
FIG. 15 is a block diagram showing a structure of a driver of an equalize signal.

Referring to the block diagram of FIG. 15, the driver of an equalize signal includes a driver circuit unit DV801 and a latch circuit unit LT. Driver circuit unit DV801 includes inverters IV801 and IV802, NAND circuits ND801, ND802, a P channel MOS transistor PT801, and an N channel MOS transistor NT801. Inverter IV801 inverts equalize signal ES. NAND circuit ND801 provides the NAND of the output of inverter IV801 and enable signal EN. NAND circuit ND802 provides the NAND of enable signal EN and equalize signal ES. Inverter IV802 inverts the output of NAND circuit ND802. P and N channel MOS transistors PT801 and NT801 are connected in series between sub boosted line Vp30 and sub-ground line Vs30.

Latch control unit LT includes NAND circuits ND803–ND805. NAND circuit ND803 provides the NAND of precharge signal PR and an equalize signal ESR during a self refresh. NAND circuit ND804 provides the NAND of output of NAND circuit ND803 and the voltage of equalize line EQ. NAND circuit ND805 provides the NAND of the output of NAND circuit ND804 and inverted equalize signal /ESR of a self refresh. The output node of NAND circuit ND805 is connected to equalize line EQ and the input of NAND circuit ND804.

Equalize line EQ is connected common to the gates of a plurality of transistors NEQ provided between the plurality of bit line pairs BL, /BL in memory cell array MA.

When in an normal mode, connection is established between sub boosted line Vp30 and main boosted line Vpp and between sub-ground line Vs30 and ground line Vss. Equalize line EQ is under the control of the tri-status by driver circuit unit DV801. When in a power down mode, sub boosted line Vp30 is disconnected from main boosted line Vp, and sub-ground line Vs30 is disconnected from ground line Vss. The leakage current is reduced analogous to the hierarchical power source structure shown in FIG. 8. Latch unit LT holds the potential of equalize line EQ. In a self refresh operation, the H and L levels of equalize line EQ is controlled by controlling the drive of latch unit LT.

Similar circuitry is provided for the word line activation signal and the sense amplifier activation signal.

Fourth Embodiment

In the semiconductor memory device of the first embodiment, supply of power towards logic unit 100 is suppressed in the power down mode. Therefore, there is a possibility of the data being lost in the case where the data is stored in logic unit 100. The semiconductor memory device of the fourth embodiment is directed to eliminate such a problem.

Figure 16:
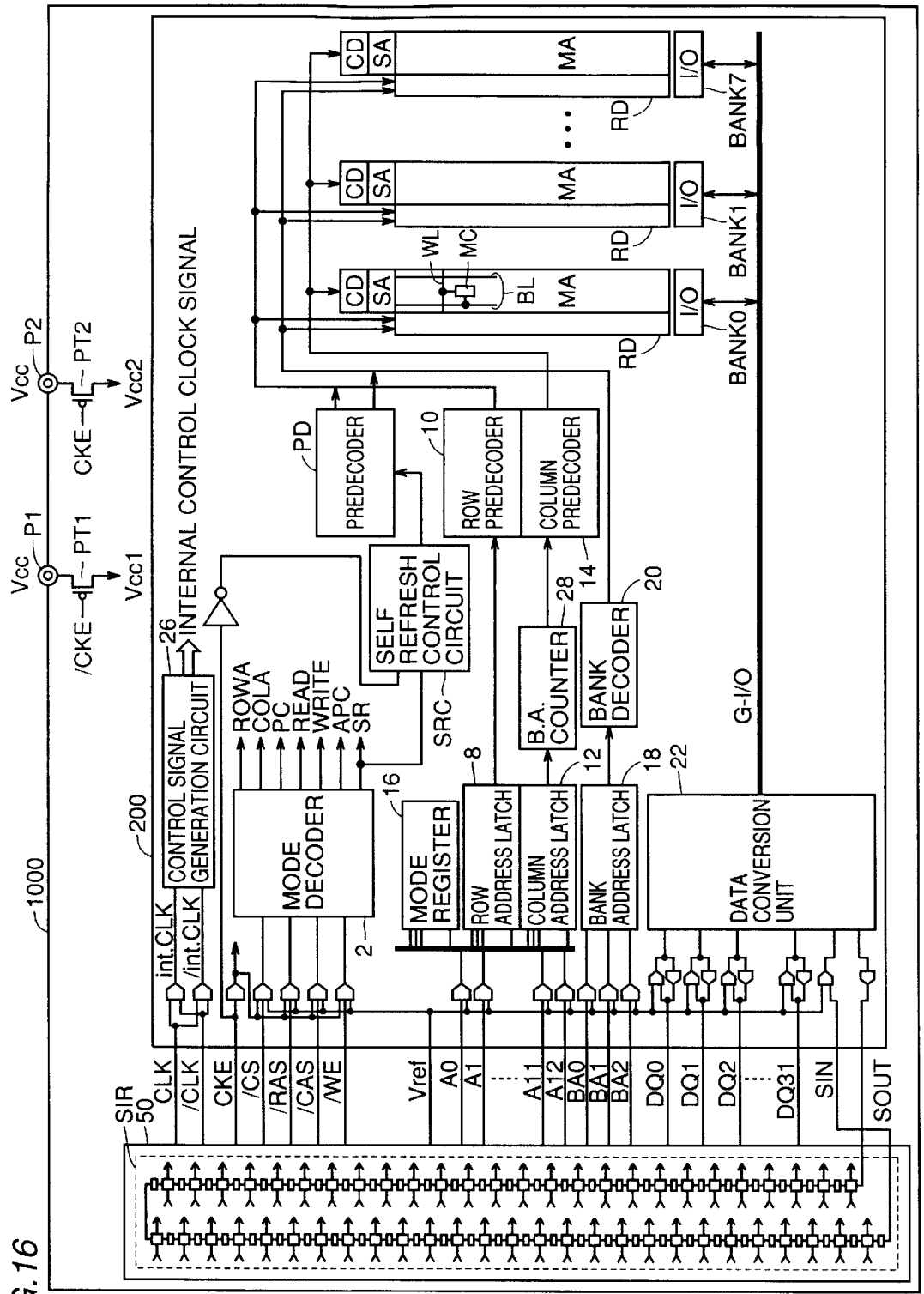
FIG. 16 is a block diagram showing an entire structure of a semiconductor memory device according to a fourth embodiment of the present invention.

Referring to the block diagram of FIG. 16, the semiconductor memory device of the fourth embodiment includes a logic unit 50 instead of logic unit 100 shown in FIG. 1. Logic unit 50 includes a serial register SIR. The input of serial data from serial register SIR to data conversion unit 22 is carried out through an input line SIN. The output of the serial data from data conversion unit 22 to serial register SIR is carried out through an output line SOUT. Conversion from serial data to parallel data and conversion from parallel data to serial data are carried out by data conversion unit 22.

Figure 17:
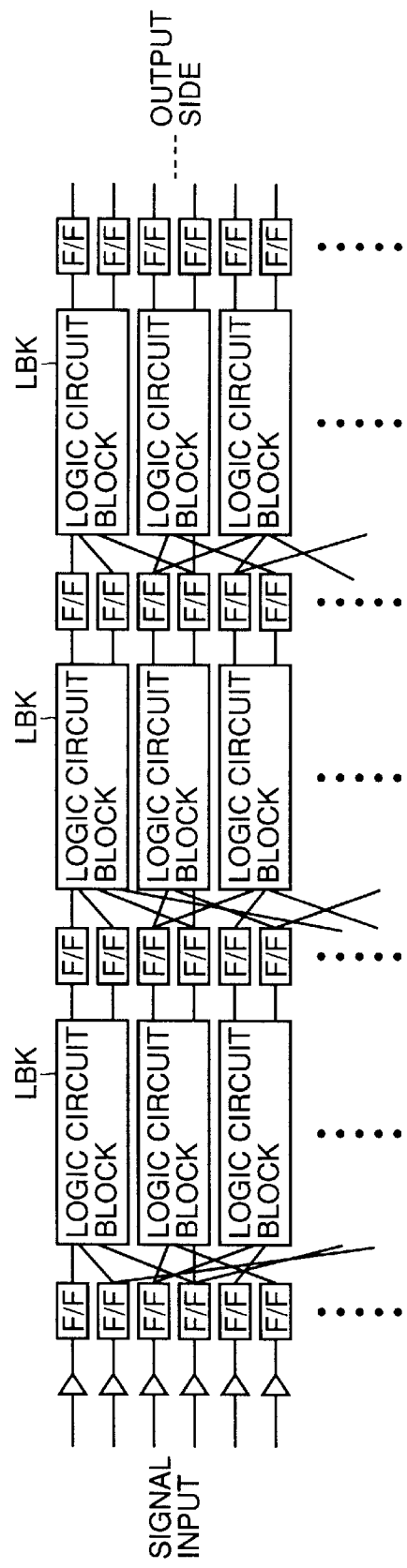
FIG. 17 is a block diagram showing the structure of a logic unit of FIG. 16.

Referring to the block diagram of FIG. 17, logic unit 50 includes a plurality of logic circuit blocks LBK, and a plurality of flip flop circuits F/F. A flip flop circuit F/F is provided between logic circuit blocks LBK. According to the general logic design, circuitry is operated in synchronization with a clock. Therefore, the result of each logic circuit block LBK is latched by a corresponding flip flop circuit F/F at every clock. The result is transmitted to logic circuit block LBK of the next stage at the next clock cycle.

Figure 18:
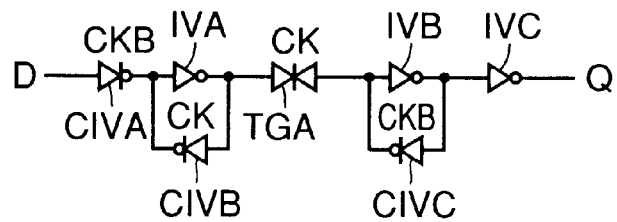
FIG. 18 is a block diagram showing a structure of a flip flop circuit of FIG. 17.
Figure 19:
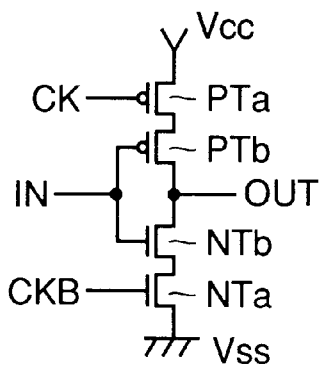
FIG. 19 is a circuit diagram showing a structure of a clocked inverter of FIG. 18.
Figure 20:
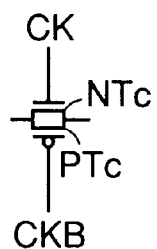
FIG. 20 is a circuit diagram showing a structure of a transfer gate of FIG. 18.

Referring to the block diagram of FIG. 18, flip flop circuit F/F includes clocked inverters CIVA–CIVC, inverters IVA–IVC, and a transfer gate TGA. As shown in FIG. 19, clocked inverters CIVA and CIVC are formed of P channel MOS transistors PTa and PTb and N channel MOS transistors NTa and NTb. P channel MOS transistor PTb and N channel MOS transistor NTb form an inverter. P channel MOS transistor PTa is connected between power supply node Vcc and P channel MOS transistor PTb to receive a signal CK at its gate. N channel MOS transistor NTa is connected between N channel MOS transistor NTb and ground node Vss to receive a signal CKB that is complementary to signal CK at its gate. Clocked inverter CIVB is similar to the clocked inverter shown in FIG. 19, provided that the signal supplied to the gate of P channel MOS transistor PTa is signal CKB and the signal supplied to the gate of N channel MOS transistor NTa is signal CK. Inverter IVA inverts the output of clocked inverter CIVA. Inverter IVA and clocked inverter CIVB form a latch circuit. As shown in FIG. 20, transfer gate TGA is formed of P channel MOS transistor PTc receiving signal CKB at its gate and N channel MOS transistor NTc receiving signal CK at its gate. Inverter IVB inverts the output of clocked inverter CIVC. Inverter IVB and clocked inverter CIVC form a latch circuit. Inverter IVC inverts the output from inverter IVB to provide the inverted signal as output signal Q.

Figure 21:
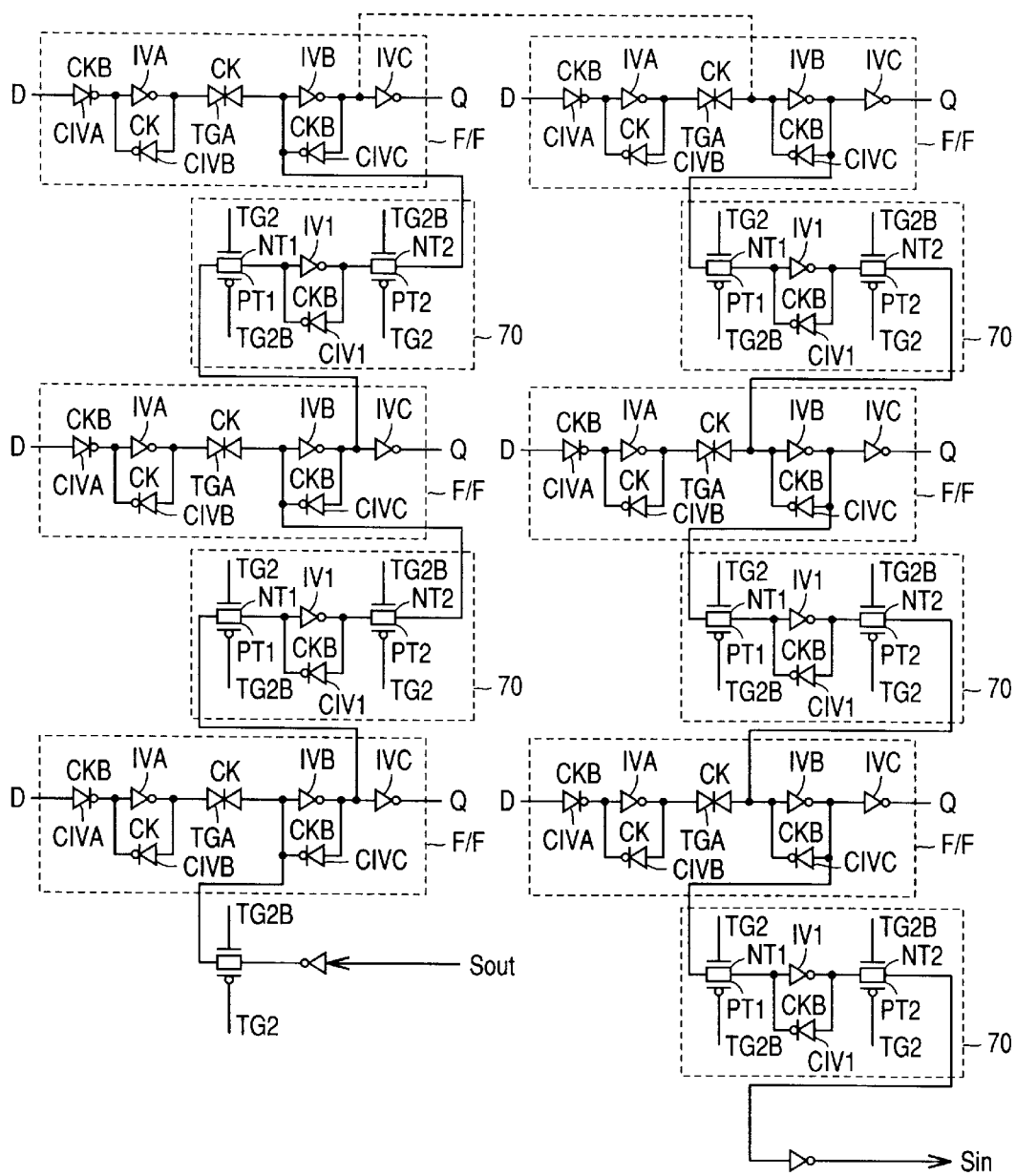
FIG. 21 is a block diagram showing a structure of a serial register of FIG. 16.

Referring to the block diagram of FIG. 21, serial register SIR has flip flop circuit F/F that is required to store information in a power down mode out of the flip flop circuits F/F shown in FIG. 17 connected in series through latch circuit 70. Latch circuit 70 includes a transfer gate formed of a P channel MOS transistor PT1 and an N channel MOS transistor NT1, a latch circuit formed of inverter IV1 and clocked inverter CIV1, and a transfer gate formed of a P channel MOS transistor PT2 and an N channel MOS transistor NT2. P channel MOS transistor PT1 and N channel MOS transistor NT2 are turned on/off in response to a signal TG2B. P channel MOS transistor PT2 and N channel MOS transistor NT1 are turned on/off in response to a signal TG2. Clocked inverter CIV1 has a structure similar to that of clocked inverter CIVC.

Figure 22:
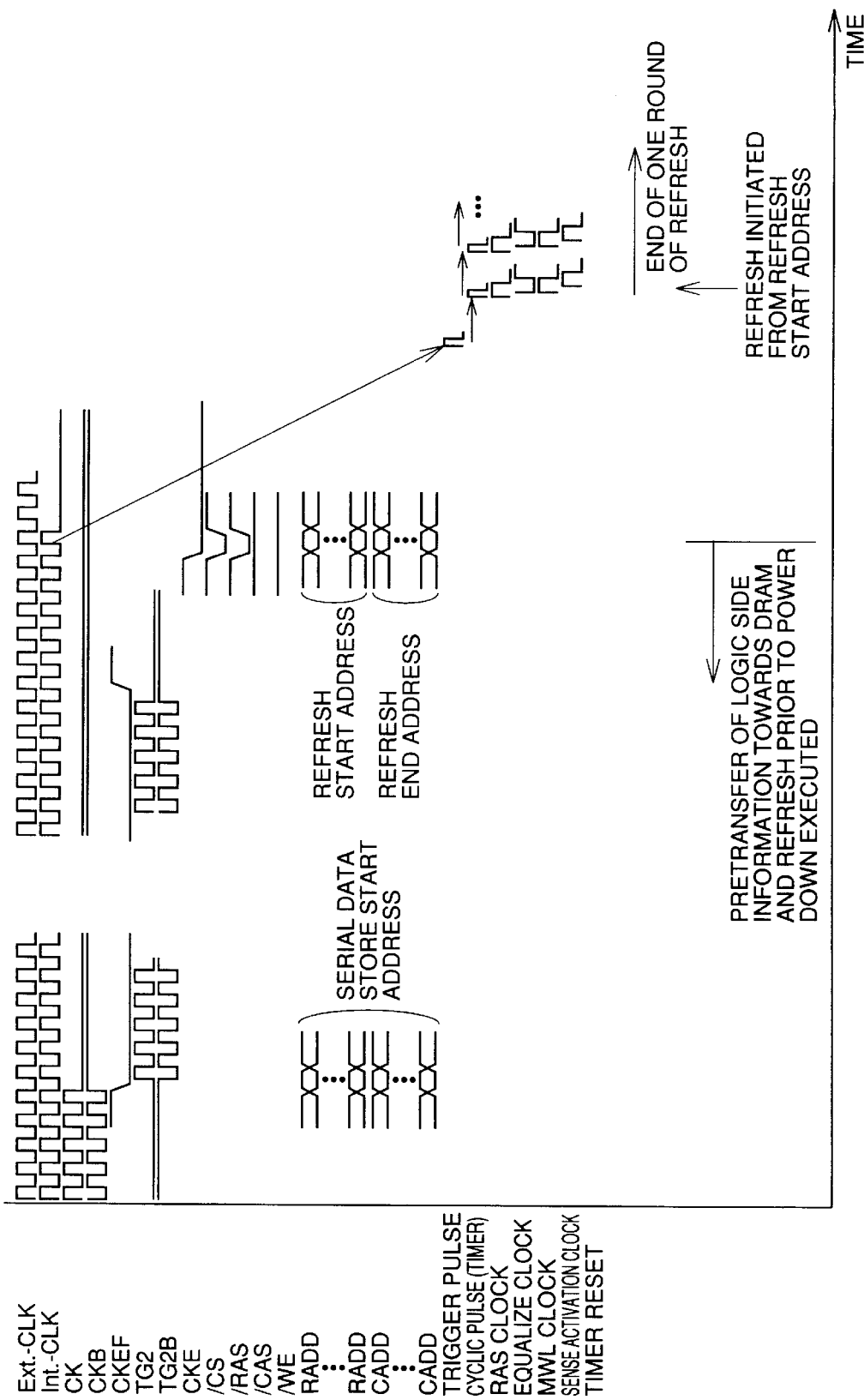
FIG. 22 is a timing chart for describing an operation of transferring serial data from a logic unit to a DRAM unit.

Latch data recognition signal CKEF attains an L level to initiate serial transfer before clock enable signal CKE attains an L level (before power down state is set), as shown in FIG. 22. The cycle of activating latch data recognition signal CKEF corresponds to the writing of serial data into the DRAM unit with any address as the start address.

During the serial data transfer, signals CK and CKB attain an L level and an H level, respectively, to interrupt the synchronization operation. Also, the operation of logic circuit block LBK between flip flop circuits F/F is suppressed. Under this state, signals TG2 and TG2B are rendered active alternately, whereby the data in the latch circuit formed of inverter IV1 and clocked inverter CIV1 is sequentially transferred towards the DRAM as serial data. As a result, the data is maintained in the memory cell.

The serial data of logic unit 50 is sent to DRAM unit 200 through input line SIN. DRAM unit 200 sequentially stores the input serial data through input line SIN in the memory array.

Following the end of the serial transfer, clock enable signal CKE is driven to an L level. As a result, the power down mode is entered. Accordingly, logic unit 50 has the power turned off. Also, the circuitry not required for a self refresh operation in DRAM unit 200 has the power turned off. However, the data from logic unit 50 is maintained since a self refresh operation to maintain the data from the memory cell array is carried out.

As shown in FIG. 23, the data stored in DRAM unit 200 is returned to flip flop circuit F/F of logic unit 50 when clock enable signal CKE is pulled up to an H level from the L level to return to the normal mode from the power down mode, as shown in FIG. 23. Before the operation is initiated, refresh is executed by a dummy cycle to refresh the data in the memory cell. By providing the output for the required number of cycles, the information required for the operation is set in each latch at the logic side.

According to the fourth embodiment of the present invention, the required data stored in a plurality of flip flop circuits F/F in logic unit 50 is transferred to the memory cell in DRAM unit 200 before entering a power down mode. The data is returned to the former flip flop circuit F/F from the memory cell when returning to the normal mode from the power down mode. Thus, required data will not be lost even when power supply to logic unit 50 is suppressed during the power down mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a normal mode and a power down mode, comprising:
    a plurality of memory cells arranged in rows and columns;
    a plurality of first word lines arranged in rows;
    a plurality of bit line pairs arranged in columns;
    a sense amplifier amplifying a data signal of said plurality of bit line pairs;
    an address buffer generating an internal address signal in response to an external address signal;
    a self refresh control circuit generating a refresh address signal in said power down mode;
    a row decoder generating a decode signal in response to said internal address signal in said normal mode, and generating the decode signal in response to said refresh address signal in said power down mode;
    a plurality of first word line drivers provided corresponding to said plurality of first word lines to activate the first word line in response to said decode signal;
    a first power supply supplying a power supply voltage to said sense amplifier, said address buffer, said self refresh control circuit, said row decoder, and said plurality of first word line drivers in said normal mode, and not supplying the power supply voltage to said sense amplifier, said address buffer, said self refresh control circuit, said row decoder, and said plurality of first word line drivers in said power down mode; and
    a second power supply supplying a power supply voltage to said sense amplifier, said self refresh control circuit, said row decoder and said plurality of first word line drivers in said power down mode, and not supplying the power supply voltage to said sense amplifier, said self refresh control circuit, said row decoder and said plurality of first word line drivers in said normal mode.

2. The semiconductor memory device according to claim 1, wherein said self refresh control circuit bursts said refresh address signal at intervals of predetermined time.

3. The semiconductor memory device according to claim 1, wherein each of said plurality of first word line drivers comprises
    a drive signal generation circuit generating a drive signal when receiving a corresponding decode signal from said row decoder,
    a first drive circuit activating a corresponding first word line in response to said drive signal in said normal mode, and
    a second drive circuit activating said corresponding first word line in response to said drive signal in said power down mode.

4. The semiconductor memory device according to claim 3, wherein said second drive circuit comprises a transfer gate connected between said drive signal generation circuit and said first word line, and turned on when self refresh is carried out.

5. The semiconductor memory device according to claim 4, further comprising:
    a main boosted line receiving a voltage higher than said power supply voltage;
    first and second sub boosted lines;
    a main ground line receiving a ground voltage;
    first and second sub-ground lines;
    a first connection circuit connecting said main boosted line and said first sub boosted line in said normal mode, and disconnecting said main boosted line and said first sub boosted line in said power down mode;
    a second connection circuit connecting said main ground line and said first sub-ground line in said normal mode or when self refresh is not carried out in said power down mode, and disconnecting said main ground line and said first sub-ground line when self refresh is carried out in said power down mode;
    a third connection circuit connecting said main boosted line and said second sub boosted line in said normal mode or when self refresh is not carried out in said power down mode, and disconnecting said main boosted line and said second sub boosted line when self refresh is carried out in said power down mode; and
    a fourth connection circuit connecting said main ground line and said second sub-ground line in said normal mode, and disconnecting said main ground line and said second sub-ground line in said power down mode, wherein said first drive circuit includes
a first inverter connected between said first sub boosted line and said first sub-ground line to output an inverted signal of said drive signal in response to said drive signal, and
a second inverter connected between said second sub boosted line and said second sub-ground line to receive an output of said first inverter and activate said corresponding first word line.

6. The semiconductor memory device according to claim 3, further comprising:
a main boosted line receiving a voltage higher than said power supply voltage;
first and second sub boosted lines;
a main ground line receiving a ground voltage;
first and second sub-ground lines;
a first connection circuit connecting said main boosted line and said first sub boosted line in said normal mode, and disconnecting said main boosted line and said first sub boosted line in said power down mode;
a second connection circuit connecting said main ground line and said first sub-ground line in said normal mode or when self refresh is not carried out in said power down mode, and disconnecting said main ground line and said first sub-ground line when self refresh is carried out in said power down mode;
a third connection circuit connecting said main boosted line and said second sub boosted line in said normal mode or when self refresh is not carried out in said power down mode, and disconnecting said main boosted line and said second sub boosted line when self refresh is carried out in said power down mode; and
a fourth connection circuit connecting said main ground line and said second sub-ground line in said normal mode, and disconnecting said main ground line and said second sub-ground line in said power down mode, wherein
said first drive circuit includes
a first inverter connected between said first sub boosted line and said first sub-ground line to output an inverted signal of said drive signal in response to said drive signal, and
a second inverter connected between said second sub boosted line and said second sub-ground line to receive an output of said first inverter and activating said corresponding first word line.

7. The semiconductor memory device according to claim 1, wherein said row decoder comprises
a first decode circuit generating a decode signal in response to said internal address signal in said normal mode, and
a second decode circuit generating a decode signal in response to said refresh address signal in said power down mode.

8. The semiconductor memory device according to claim 1, further comprising:
a plurality of sub decoders generating a sub decode signal in response to said decode signal; and
a plurality of blocks provided corresponding to said plurality of sub decoders;
each of said plurality of blocks including
a plurality of second word lines provided corresponding to said plurality of first word lines, and
a plurality of second word line drivers provided corresponding to said plurality of second word lines, each for activating the corresponding second word line in response to a voltage of the corresponding first word line and the sub decode signal from the corresponding sub decoder,
each of said plurality of sub decoders including
a drive signal generation circuit generating a drive signal when receiving a corresponding decode signal from said row decoder,
a first sub decode circuit generating said sub decode signal in response to said drive signal in said normal mode, and
a second sub decode circuit generating said sub decode signal in response to said drive signal in said power down mode.

9. The semiconductor memory device according to claim 1, further comprising:
a plurality of transistors provided corresponding to said plurality of bit line pairs, each being connected between bit lines of a corresponding one of said bit line pairs;
an equalize line connected common to gates of said plurality of transistors;
a driver activating said equalize line in response to an equalize signal in said normal mode; and
a latch circuit activating said equalize line in response to said equalize signal in said power down mode.

10. A semiconductor memory device having a normal mode and a power down mode, comprising:
a main power supply line receiving a power supply voltage;
a main ground line receiving a ground voltage;
first and second sub-power supply lines;
first and second sub-ground lines;
a plurality of memory cells arranged in rows and columns;
a plurality of first word lines arranged in rows;
a plurality of bit line pairs arranged in columns;
a sense amplifier amplifying a data signal of said plurality of bit line pairs;
an address buffer generating an internal address signal in response to an external address signal;
a self refresh control circuit generating a refresh address signal in said power down mode;
a row decoder generating a decode signal in response to said internal address signal in said normal mode, and generating a decode signal in response to said refresh address signal in said power down mode;
a plurality of first word line drivers provided corresponding to said plurality of first word lines to activate the first word line in response to said decode signal;
a first connection circuit connecting said main power supply line and said first sub-power supply line in said normal mode, and disconnecting said main power supply line and said first sub-power supply line in said power down mode;
a second connection circuit connecting said main ground line and said first sub-ground line in said normal mode, and disconnecting said main ground line and said first sub-ground line in said power down mode;
a third connection circuit connecting said main power supply line and said second sub-power supply line in said power down mode, and disconnecting said main power supply line and said second sub-power supply line in said normal mode; and
a fourth connection circuit connecting said main ground line and said second sub-ground line in said power down mode, and disconnecting said main ground line and said second sub-ground line in said normal mode, wherein said address buffer includes a plurality of first logic circuits connected between said main power supply line and said first sub-ground line to output a signal of a high logic level in said power down mode, and a plurality of second logic circuits connected between said first sub-power supply line and said main ground line to output a signal of a low logic level in said power down mode, and said self refresh control circuit includes a plurality of third logic circuits connected between said main power supply line and said second sub-ground line to output a signal of a high logic level in said normal mode, and a plurality of fourth logic circuits connected between said second sub-power supply line and said main ground line to output a signal of a low logic level in said normal mode.

11. The semiconductor memory device according to claim 10, wherein said self refresh control circuit bursts said refresh address signal at intervals of predetermined time.

12. The semiconductor memory device according to claim 10, wherein said row decoder comprises a first decode circuit generating a decode signal in response to said internal address signal in said normal mode, and a second decode circuit generating a decode signal in response to said refresh address signal in said power down mode.

13. The semiconductor memory device according to claim 10, further comprising:

a plurality of sub decoders generating a sub decode signal in response to said decode signal; and a plurality of blocks provided corresponding to said plurality of sub decoders;

each of said plurality of blocks including a plurality of second word lines provided corresponding to said plurality of first word lines, and a plurality of second word line drivers provided corresponding to said plurality of second word lines, each for activating the corresponding second word line in response to a voltage of the corresponding first word line and the sub decode signal from the corresponding sub decoder, each of said plurality of sub decoders including a drive signal generation circuit generating a drive signal when receiving a corresponding decode signal from said row decoder, a first sub decode circuit generating said sub decode signal in response to said drive signal in said normal mode, and a second sub decode circuit generating said sub decode signal in response to said drive signal in said power down mode.

14. A semiconductor device having a normal mode and a power down mode, comprising:

a logic unit including a plurality of logic circuit groups;

a DRAM unit, said DRAM unit including a plurality of memory cells arranged in rows and columns, a plurality of first word lines arranged in rows, a plurality of bit line pairs arranged in columns, a sense amplifier amplifying a data signal of said plurality of bit line pairs, an address buffer generating an internal address signal in response to an address signal applied to said DRAM unit, a self refresh control circuit generating a refresh address signal in said power down mode, a row decoder generating a decoded signal in response to said internal address signal in said normal mode, and generating a decoded signal in response to said refresh address signal in said power down mode, a plurality of first word line drivers provided corresponding to said plurality of first word lines, for activating the first word line in response to said decoded signal;

a first power supply supplying a power supply voltage to said logic unit, said sense amplifier, said address buffer, said self refresh control circuit, said row decoder and said plurality of first word line drivers in said normal mode, and not supplying the power supply voltage to said logic unit, said sense amplifier, said address buffer, said self refresh control circuit, said row decoder and said plurality of first word line drivers in said power down mode;

a second power supply supplying a power supply voltage to said sense amplifier, said self refresh control circuit, said row decoder and said plurality of first word line drivers in said power down mode, and not supplying the power supply voltage to said sense amplifier, said self refresh control circuit, said row decoder and said plurality of first word line drivers in said normal mode; and a temporary save circuit saving data of said plurality of logic circuit groups temporarily into said DRAM unit in said power down mode.

15. The semiconductor device according to claim 14, wherein said a temporary save circuit includes a serial register simultaneously receiving data of said plurality of logic circuit groups and outputting the received data serially.

16. A semiconductor memory device having a normal mode and a power down mode, comprising:

a plurality of memory cells arranged in rows and columns;

a plurality of first word lines arranged in rows;

a plurality of bit line pairs arranged in columns;

a sense amplifier amplifying a data signal of said plurality of bit line pairs;

an address buffer generating an internal address signal in response to an external address signal;

a self refresh control circuit generating a refresh address signal in said power down mode;

a row decoder generating a decode signal in response to said internal address signal in said normal mode, and generating the decode signal in response to said refresh address signal in said power down mode;

a plurality of first word line drivers provided corresponding to said plurality of first word lines to activate the first word line in response to said decode signal;

a first power supply supplying a power supply voltage to said sense amplifier, said address buffer, said self refresh control circuit, said row decoder, and said plurality of first word line drivers only in said normal mode, and supplying no power supply voltage to said sense amplifier, said address buffer, said self refresh control circuit, said row decoder, and said plurality of first word line drivers in said power down mode; and a second power supply supplying a power supply voltage to said sense amplifier, said self refresh control circuit, said row decoder and said plurality of first word line drivers only in said power down mode, and supplying no power supply voltage to said sense amplifier, said self refresh control circuit, said row decoder and said plurality of first word line drivers in said normal mode.

* * * * *